US007969799B2

(12) United States Patent
Butt et al.

(10) Patent No.: US 7,969,799 B2
(45) Date of Patent: Jun. 28, 2011

(54) MULTIPLE MEMORY STANDARD PHYSICAL LAYER MACRO FUNCTION

(75) Inventors: Derrick Sai-Tang Butt, San Leandro, CA (US); Cheng-Gang Kong, Saratoga, CA (US); Terence J. Magee, San Francisco, CA (US); Thomas Hughes, San Francisco, CA (US)

(73) Assignee: LSI Corporation, Milpitas, CA (US)

( * ) Notice: Subject to any disclaimer, the term of this patent is extended or adjusted under 35 U.S.C. 154(b) by 509 days.

(21) Appl. No.: 12/109,643

(22) Filed: Apr. 25, 2008

(65) Prior Publication Data

US 2009/0091987 A1    Apr. 9, 2009

Related U.S. Application Data

(60) Provisional application No. 60/978,422, filed on Oct. 9, 2007.

(51) Int. Cl.
  G11C 7/10 (2006.01)
  G11C 7/00 (2006.01)
  G11C 8/00 (2006.01)
  G11C 8/18 (2006.01)

(52) U.S. Cl. ......... 365/189.16; 365/189.05; 365/189.14; 365/233.13; 365/233.16

(58) Field of Classification Search ............. 365/189.05, 365/189.03, 189.14, 189.15, 189.16, 230.08, 365/233.13, 233.16
See application file for complete search history.

(56) References Cited

U.S. PATENT DOCUMENTS

| | | | |
|---|---|---|---|
| 7,243,254 B1 * | 7/2007 | Kuroodi et al. | 713/600 |
| 2001/0054135 A1 * | 12/2001 | Matsuda | 711/167 |
| 2002/0176309 A1 * | 11/2002 | Kwak | 365/230.05 |
| 2006/0013060 A1 * | 1/2006 | Li et al. | 365/233 |
| 2006/0174140 A1 * | 8/2006 | Harris et al. | 713/300 |
| 2007/0195613 A1 * | 8/2007 | Rajan et al. | 365/189.05 |
| 2008/0201597 A1 * | 8/2008 | Chong et al. | 713/401 |

* cited by examiner

*Primary Examiner* — J. H. Hur
(74) *Attorney, Agent, or Firm* — Christopher P. Maiorana, PC

(57) ABSTRACT

A memory interface physical layer macro including one or more embedded input/output (I/O) buffers, one or more memory interface hardmacros and control logic. The one or more embedded input/output (I/O) buffers support a plurality of I/O supply voltage levels. The one or more memory interface hardmacros are coupled to the one or more embedded I/O buffers. The control logic controls the one or more hardmacros and the one or more I/O buffers.

22 Claims, 19 Drawing Sheets

MULTIPLE MEMORY STANDARD PHYSICAL LAYER MACRO FUNCTION

This application claims the benefit of U.S. Provisional Application No. 60/978,422, filed Oct. 9, 2007 and is hereby incorporated by reference in its entirety.

FIELD OF THE INVENTION

The present invention relates to memory interfacing generally and, more particularly, to a single physical layer macro function that supports multiple memory standards.

BACKGROUND OF THE INVENTION

DDR2, DDR3, RLDRAM and SRAM memories have different electrical and functional specifications. No one solution exists that supports multiple memory interfaces. It would be desirable to have a single physical layer (PHY) macro function that is functionally and electrically compatible with multiple memory standards and provides a complete physical layer function in a single silicon solution.

SUMMARY OF THE INVENTION

The present invention concerns a memory interface physical layer macro including one or more embedded input/output (I/O) buffers, one or more memory interface hardmacros and control logic. The one or more embedded input/output (I/O) buffers support a plurality of I/O supply voltage levels. The one or more memory interface hardmacros are coupled to the one or more embedded I/O buffers. The control logic controls the one or more hardmacros and the one or more I/O buffers.

The objects, features and advantages of the present invention include providing a single physical layer macro function that may (i) support multiple memory technologies and/or standards, (ii) provide wide configurability, (iii) support DDR2/DDR3 SDRAM, (iv) support RLDRAM-II+, DDR-II/DDR-II+ and QDR-II/QDR-II+ SRAM, (v) include embedded input/output (I/O) buffers, (vi) provide complete physical layer function in a single silicon solution and/or (vii) support both 1.5V and 1.8V memory standards.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
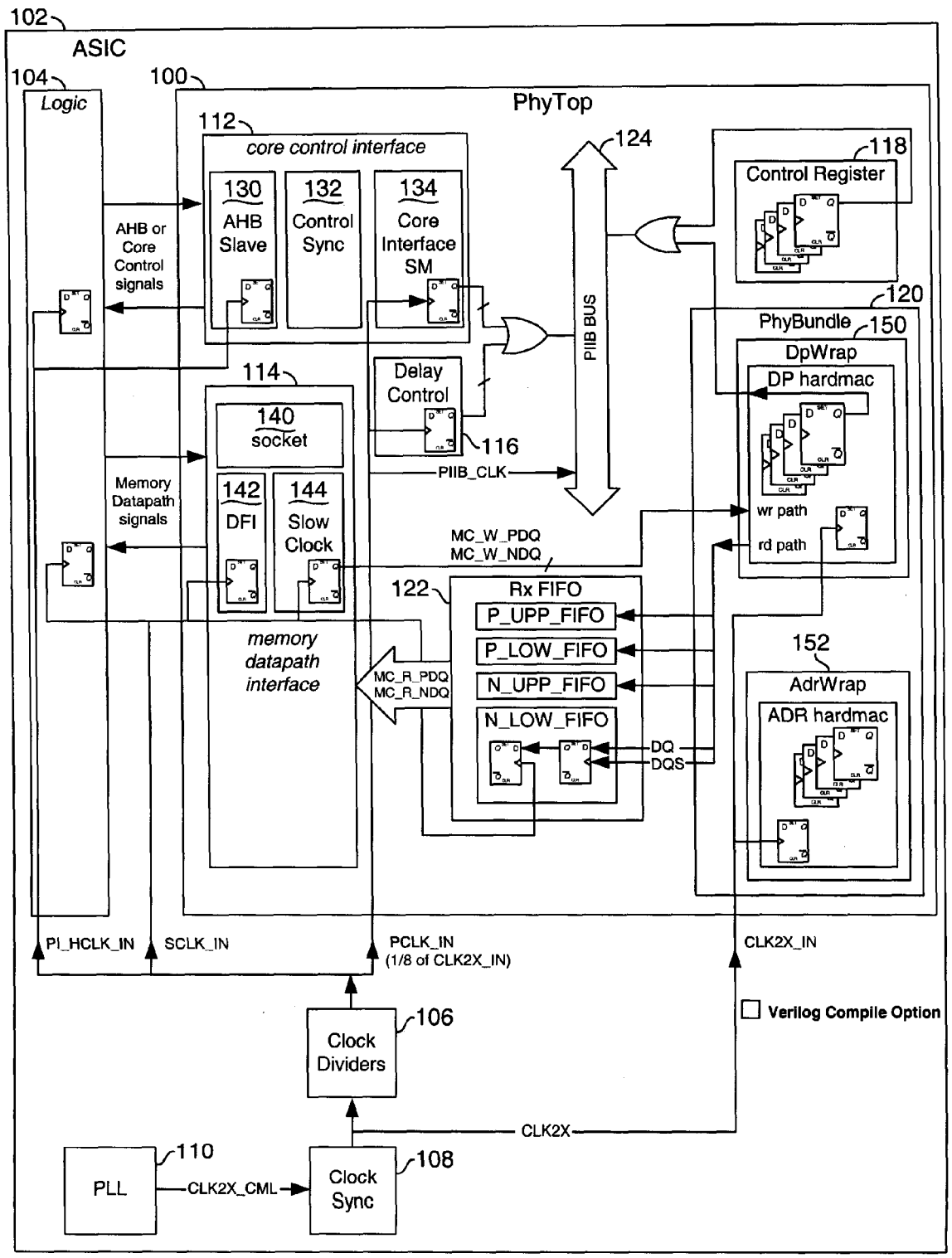
FIG. 1 is a block diagram illustrating functional blocks of a physical layer macro function in accordance with the present invention.

Referring to FIG. 1, a block diagram illustrating functional blocks of a physical layer (PHY) macro function 100 in accordance with the present invention is shown. The PHY 100 may be instantiated on an application specific integrated circuit (ASIC) 102 to provide a memory interface PHY that supports multiple memory technologies and standards. For example, the PHY 100 may provide physical memory interfaces for DDR3 SDRAM, DDR2 SDRAM, DDR-II/DDR-II+ SRAM, QDR-II/QDR-II+ SRAM (single or dual ports) and/or RLDRAM-II SRAM (single or dual ports). For example, the PHY 100 generally includes the hardware components that support the functionality and electrical specifications for all memory interfaces listed above.

When the PHY 100 is configured to implement a DDR3 SDRAM memory interface physical layer, the PHY 100 may provide (i) support for 4 or 8 DQ bits per DQS bit, (ii) support for x4, x8, x16, and x32 memory devices, (iii) 1.5V SSTL I/O buffers, (iv) performance ranging from 400 MHz/800 Mbits/sec to 667 MHz/1333 Mbits/sec, (v) a configurable DQ bus width from 8 to 72 bits in multiples of 8 bits per instantiation, (vi) a configurable ADR/Command bus width from 18 to 48 bits, (vii) a pre-defined IO Ring for optimal performance and (viii) Denali PHY Interface (DFI) compliance for seamless Denali memory controller integration. The PHY 100 may implement a 4:1 DQ:DQS ratio for the x32 memory device configuration.

When the PHY 100 is configured to implement a DDR2 SDRAM memory interface physical layer, the PHY 100 may provide (i) support for 4 or 8 DQ bits per DQS bit, (ii) support for x4, x8, x16, and x32 memory devices, (iii) 1.8V SSTL I/O buffers, (iv) performance ranging from 200 MHz/400 Mbits/sec to 400 MHz/800 Mbits/sec, (v) a configurable DQ bus width from 8 to 72 bits in multiples of 8 bits per instantiation, (vi) a configurable ADR/Command bus width from 18 to 48 bits, (vii) a pre-defined IO Ring for optimal performance and (viii) Denali PHY Interface (DFI) compliance for seamless Denali memory controller integration. The PHY 100 may implement a 4:1 DQ:DQS ratio for the x32 memory device configuration.

When the PHY 100 is configured to implement a DDR-II/DDR-II+ SRAM memory interface physical layer, the PHY 100 may provide (i) support for 18 or 36 DQ bits per data strobe, (ii) support for x18 and x36 DDR-II/DDR-II+memory devices, (iii) a 1.5/1.8V HSTL I/O buffer for DDR-II SRAM, (iv) a 1.8V HSTL I/O buffer for DDR-II+ SRAM, (v) performance ranging from 200 MHz/400 Mbits/sec to 400 MHz/800 Mbits/sec, (vi) optimization for common input/output (CIO) application, (vii) support for separate input/output (SIO) application, (viii) a pre-defined IO Ring and (ix) a configurable 18, 36, or 72 bit data bus.

When the PHY 100 is configured to implement a QDR-II/QDR-II+ SRAM memory interface physical layer, the PHY 100 may provide (i) support for 18 or 36 DQ bits per data strobe, (ii) support for x18 and x36 QDR-II/QDR-II+memory devices, (iii) a 1.5/1.8V HSTL I/O buffer for QDR-II SRAM, (iv) a 1.8V HSTL I/O buffer for QDR-II+ SRAM, (v) performance ranging from 200 MHz/400 Mbits/sec to 400 MHz/800 Mbits/sec, (vi) optimization for common input/output (CIO) application, (vii) support for separate input/output (SIO) application, (viii) a pre-defined IO Ring and (ix) a configurable 18, 36, or 72 bit data bus.

When the PHY 100 is configured to implement a RLDRAM-II SDRAM memory interface physical layer, the PHY 100 may provide (i) support for 18 or 36 DQ bits per data strobe, (ii) support for x18 and x36 RLDRAM-II memory devices, (iii) a 1.5/1.8V HSTL I/O buffer for QDR-II SRAM, (iv) performance ranging from 200 MHz/400 Mbits/sec to 533 MHz/1066 Mbits/sec, (vi) optimization for common input/output (CIO) application, (vii) support for separate input/output (SIO) application, (viii) a pre-defined IO Ring and (ix) a configurable 18, 36, or 72 bit data bus.

The PHY 100 generally encapsulates physical layer functions that may include: DDR write and read data paths, address/command path, a delay locked loop (DLL) function, I/O buffer impedance control over voltage/temperature (VT) variations, I/O buffer control, embedded I/O buffers, write and read data paths management (or delay adjustment) functions, and a power management function. The DLL function may provide, in one example, quarter cycle delay tracking on read and write paths over VT variations. The write and read data paths management functions may include path gating, write leveling, read data eye training, etc. The PHY 100 may also support AHB compliant bus interfaces or Denali DFI interface to enable integration with various memory controllers.

In one example, the PHY 100 may be instantiated on the ASIC 102 along with logic 104, clock dividers 106, clock synchronization circuitry 108 and phase locked loop circuitry 110. In one example, the PHY 100 may communicate with the logic 104 via a first bus (or pathway) and a second bus (or pathway). In one example, the first bus may carry AHB or other core control signals and the second bus may carry memory datapath signals.

The clock divider 106 may be configured to present a number of clock signals (e.g., PI_HCLK_IN, SCLK_IN, PCLK_IN, etc.) to the PHY 100 and the logic 104. The clock divider 106 may be configured to generate the signals PI_HCLK_IN, SCLK_IN, PCLK_IN in response to a clock signal received from the clock synchronization circuitry 108 (e.g., CLK2X_IN). The clock synchronization circuitry 108 may be configured to generate the signal CLK2X_IN based upon a clock signal received from the PLL 110 (e.g., CLK2X_CML). The PHY 100 may also receive the signal CLK2X_IN. In one example, the signal PCLK_IN may be implemented by dividing the signal CLK2X_IN by eight.

In one example, the PHY 100 may comprise a function block (or circuit) 110, a function block (or circuit) 112, a function block (or circuit) 114, a function block (or circuit) 116, a function block (or circuit) 118, a function block (or circuit) 120, and a function block (or circuit) 122. The block 112 may be implemented as a core control interface. The block 114 may be implemented as a memory datapath interface. The block 116 may be implemented as a delay control block. The delay control block 116 may be configured to handle delay adjustments on the read path across voltage and temperature. The delay control block 116 may be parameterized with the number of instantiations of the hardmacro. The block 118 may be implemented as a control block. The block 120 may be implemented as a physical layer bundle. The block 122 may be implemented as first-in, first-out receive buffer.

The block 112 may be configured to receive and present the AHB or core control signals between the PHY 100 and the logic 104. The block 112 may be configured to handle control register accesses. The block 114 may be configured to receive and present the memory datapath signals between the PHY 100 and the block 104. The blocks 112, 116, 118 and 120 may be coupled together via a bus 124. In one example, the bus 124 may be implemented as a PHY internal interconnect bus (PIIB). The block 122 may couple the block 120 to the block 114.

In one example, the block 112 may comprise an AHB slave interface 130, a control synchronization block 132 and a core interface soft macro 134. The block 112 may be configured to handle control register accesses to registers in a register space of the PHY 100 or any associated hard macros. The block 12 may be configured to perform multiple accesses for hard macros depending upon a width of the registers to be accesses. For example, the block 112 may be configured to generate write enable signals to perform a single access to a 32-bit wide register or two consecutive accesses to a hard macro having 16-bit wide registers using the PIIB bus.

The block 114 may comprise, in one example, a socket 140 and a DFI interface 142. The socket 140 generally handles physical signal connections between memory data path I/O of the core and the I/O of the block 120 based on parameter values for different memory interface applications. For example, the socket 140 may generate QDR commands (e.g., RPS#, WPS#) and map the commands to a desired pin order on generic I/O busses of the block 120. A slow clock block 144 may be optionally included in the block 114. The slow clock block 144 may provide 2:1 or 4:1 data multiplexing or de-multiplexing when the memory controller logic is running at a clock rate of one-half or one-fourth of the PHY 1X clock domain.

In one example, the block 118 may be implemented as a plurality of registers. The registers of the block 118 may be configured as control and status register for the PHY 100. The block 118 may receive 32-bit write data bus and individual write enable signals of each 32-bit register bank from the block 112. The block 118 may provide and/or receive individual control bits, such as bits to and from the delay control block 116. The block 112 may also receive 32-bit register read data bus from the block 116 and multiplexed with the internal 32-bit read data output bus and sends it to the core control interface block 134.

The block 120 bundles up all of the address/command (ADR) and datapath (DP) hardmacros. The block 120 generally provides a higher level wrapper of the wrapper of the ADR hardmacro and wrapper of the DP hardmacro. When two types of ADR hardmacros (e.g., ADR9 and ADR12) are to be instantiated, the wrapping logic of the block 120 generally wraps the ADR9 hardmacro before wrapping the ADR12 hardmacro. All of the I/O signals of the block 120 may be assigned a generic pin name and order. The generic pin order may follow the hardmacro pin order and may be assigned, in one example, continuously when wrapping across different hardmacros. The block 120 may comprise, in one example, a block 150 and a block 152. In one example, the block 150 may comprise the datapath (DP) hardmacro and wrapper. The block 152 may comprise, in one example, one or more address (ADR) hardmacros and wrappers.

The block 122 generally receives read data from the block 120 and synchronizes the read data across clock domains. The block 122 may have two operating modes. For example, the block 122 may burst out to the core controller logic as soon as all the read data are received and synchronized into the core controller clock domain or the block 122 may stage up the read data until the user asserts a control signal (e.g., MC_R_DRAIN_FIFO).

Figure 2:
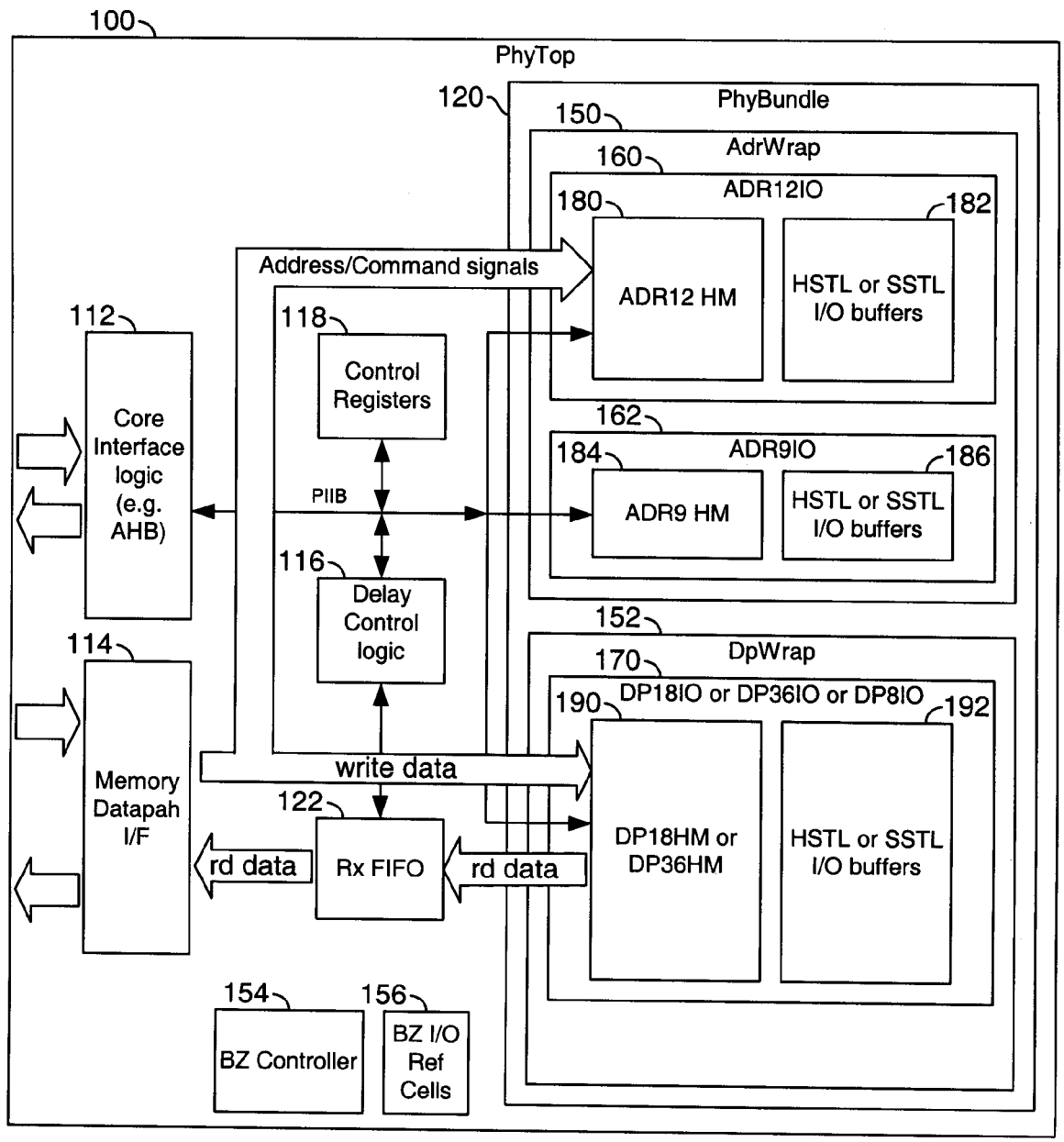
FIG. 2 is a top level diagram illustrating an architecture of a physical layer macro function in accordance with the present invention.

Referring to FIG. 2, a block diagram illustrating a top level architecture of the PHY 100 in accordance with a preferred embodiment of the present invention is shown. In one example, the PHY 100 may further include an impedance controller 154 and I/O impedance reference cells 156. The block 150 may comprise a block 160 and a block 162. The block 152 may comprise block 170. The block 160 may comprise a 12-bit ADR hardmacro. The block 162 may be implemented as a 9-bit ADR hardmacro. The block 170 may be implemented as an 8-bit, an 18-bit or a 36-bit datapath hardmacro.

The block 160 may comprise a block 180 and a block 182. The block 180 may be implemented, in one example, as an ADR 12 hard macro. The block 182 may be implemented as a number of HSTL or SSTL I/O buffers. The block 162 may comprise a block 184 and a block 186. The block 184 may be implemented, in one example, as an ADR 9 hard macro. The block 186 may be implemented as a number of HSTL or SSTL I/O buffers. The block 170 may comprise a block 190 and a block 192. The block 190 may be implemented, in one example, as a DP8, DP18 or DP36 hard macro. The block 192 may be implemented as a number of HSTL or SSTL I/O buffers. In one example, the blocks 182, 186 and 192 may comprise buffers implemented similarly to I/O cells described in commonly owned, co-pending U.S. patent application Ser. No. 12/109,497, filed Apr. 25, 2008, which is hereby incorporated by reference in its entirety.

Referring to FIGS. 3(A-D), block diagrams are shown illustrating various hardmacros in accordance with the present invention are shown. In one example, the PHY 100 may be implemented with a combination of hardmacros. The hardmacros may be selected from, in one example, a group of five types of hardmacro based upon the particular memory interface application. The five types of hardmacros may include, but are not limited to, a DP8 hardmacro (HM) 200 (FIG. 3A), a DP18 hardmacro 202 (FIG. 3B), a DP36 hardmacro 204 (not shown), an ADR9 hardmacro 206 (FIG. 3C) and an ADR12 hardmacro 208 (FIG. 3D).

Each of the hardmacros 200-208 may comprise three major components: digital datapath logic 210, I/O buffer section 212 and decoupling capacitor 214. The digital datapath logic 210 generally contains a write only or write and read datapath. The digital datapath logic 210 generally performs double data rate data multiplexing and demultiplexing. The digital datapath logic 210 generally enables read and write data or data strobe delay adjustment and performs corresponding maintenance functions.

The I/O buffer section 212 is generally compliant with SSTL and HSTL 1.5V and 1.8V standards. The I/O buffer section 212 may comprise, for example, two types of I/O buffers: single-ended and differential. The I/O buffer section 212 may have features that may include: an operating voltage range from 1.4V to 1.9V; output driver impedances that are PVT compensated and range from about 18 to about 50 ohms; slew rates that may be adjustable; pseudo-differential receivers with VREF input noise filter; ODT network having impedances that are also PVT compensated and may be adjustable from about 80 to about 300 ohms (e.g., about 40 to about 150 ohms to Vtt). In one example, the I/O buffer section 212 may comprise buffers implemented similarly to I/O cells described in commonly owned, co-pending U.S. patent application Ser. No. 12/109,497, filed Apr. 25, 2008, which is hereby incorporated by reference in its entirety.

The decoupling capacitor 214 is generally configured to minimize the SSO effects and to improve the signal quality of the I/O buffer section 212. In one example, the decoupling capacitor 214 may have about 50 pF per I/O. The decoupling capacitor 214 may have physical dimensions similar to the examples summarized in the following TABLE 1:

TABLE 1

| Hardmacro | Width (I/O side) | Height (Core Side) |
|---|---|---|
| DP8, ADR12 | 720 µm | 200 µm |
| ADR9 | 550 µm | 200 µm |

Figure 3A:
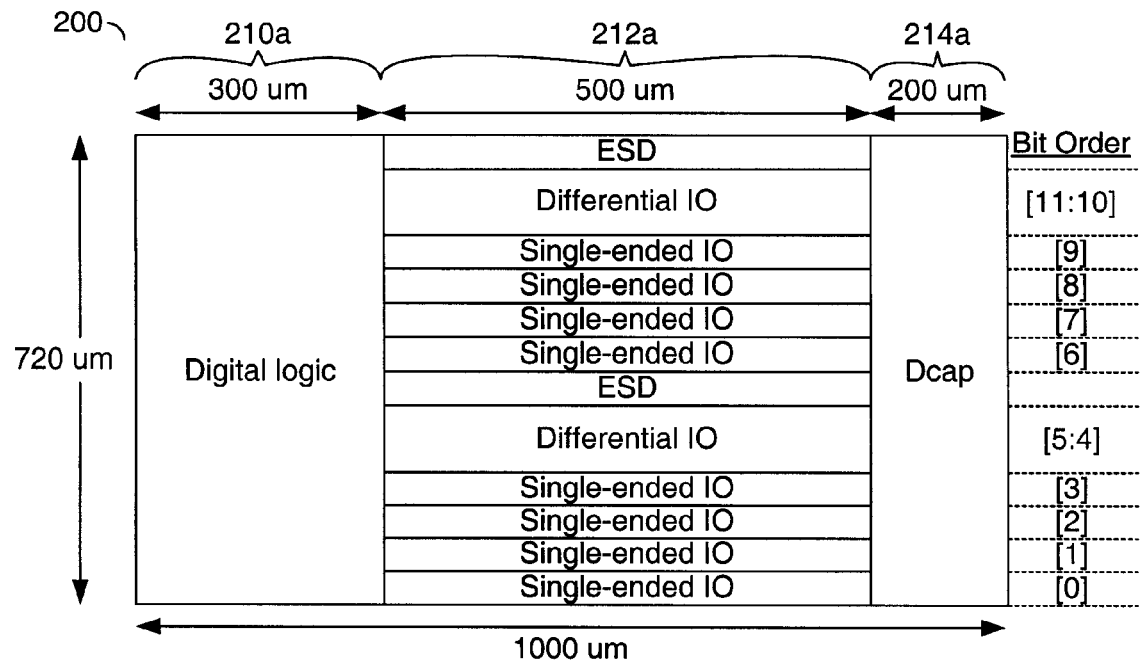
FIGS. 3(A-D) are block diagrams illustrating various hardmacros in accordance with the present invention is shown.

Referring to FIG. 3A, a diagram is shown illustrating an example DP8 hardmacro 200 in accordance with the present invention. The DP8 hardmacro 200 may include two differential clock pairs and eight single-ended data bits and I/O buffers. The data bits may be bidirectional. The DP8 hardmacro 200 may support four or eight DQs per DQS. Example physical dimensions of the DP8 hardmacro 200 may be summarized as in the following TABLE 2:

TABLE 2

| | DP8 | |
|---|---|---|
| | Width (I/O side) | Height (Core Side) |
| Digital Logic | 720 µm | 300 µm |
| IO | 720 µm | 500 µm |
| Dcap | 720 µm | 200 µm |
| Total | 720 µm | 1000 µm |

Figure 3B:
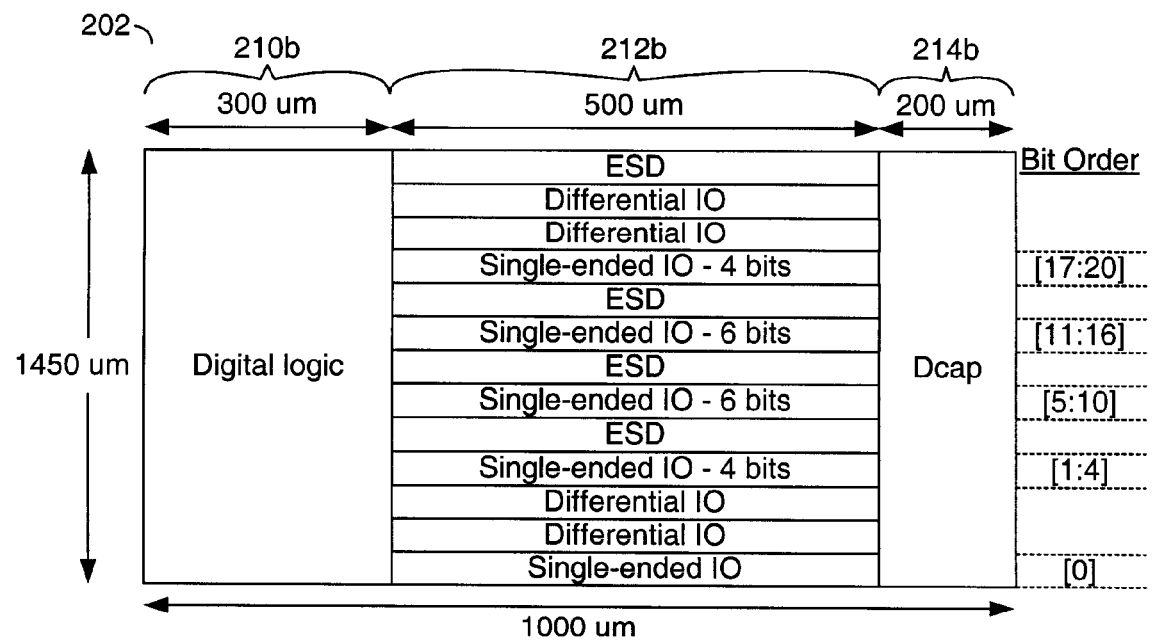

Referring to FIG. 3B, a diagram is shown illustrating an example DP18 hardmacro 202 in accordance with the present invention. The DP18 hardmacro 202 generally includes two differential clock pairs, eighteen single-ended data bits and I/O buffers. The data bits may be bidirectional. Example physical dimensions of the DP18 hardmacro 202 may be summarized as in the following TABLE 3:

TABLE 3

| | DP18 | |
|---|---|---|
| | Width (I/O side) | Height (Core Side) |
| Digital Logic | 1450 µm | 300 µm |
| IO | 1450 µm | 500 µm |
| Dcap | 1450 µm | 200 µm |
| Total | 1450 µm | 1000 µm |

The DP36 hardmacro 204 (not shown) may be implemented using two DP18 hardmacros 202. The DP36 hardmacro 204 generally has similar properties to The DP18 hardmacro 202.

Figure 3C:
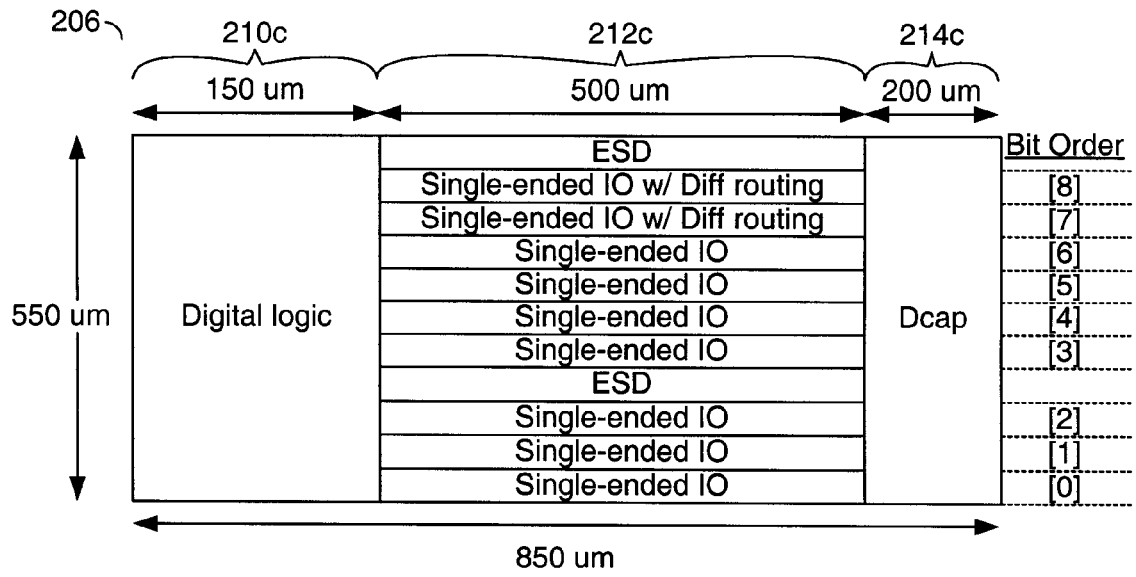

Referring to FIG. 3C, a diagram is shown illustrating an example ADR9 hardmacro 206 in accordance with the present invention. The ADR9 hardmacro 206 generally includes one pair of single-ended I/O buffers with differential routing, seven single-ended data bits and I/O buffers. The data bits are generally unidirectional. Example physical dimensions of the ADR9 hardmacro 206 may be summarized as in the following TABLE 4:

TABLE 4

| ADR9 | | |
|---|---|---|
| | Width (I/O side) | Height (Core Side) |
| Digital Logic | 550 μm | 150 μm |
| IO | 550 μm | 500 μm |
| Dcap | 550 μm | 200 μm |
| Total | 550 μm | 850 μm |

Figure 3D:
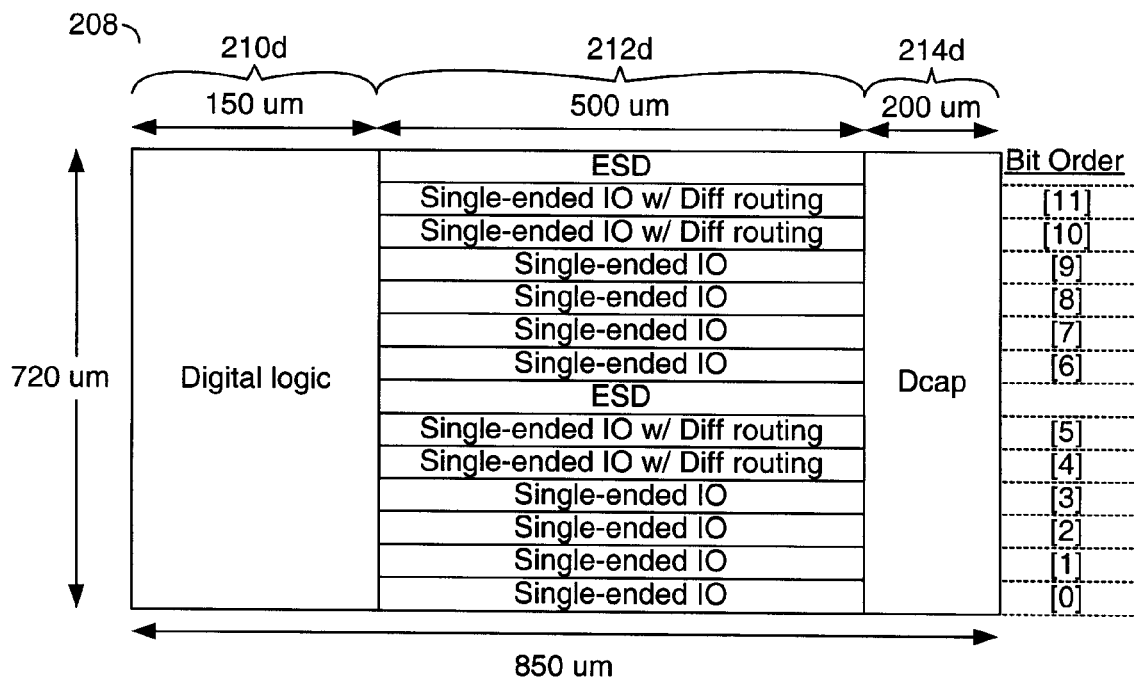

Referring to FIG. 3D, a diagram is shown illustrating an example ADR12 hardmacro 208 in accordance with the present invention. The ADR12 hardmacro 208 generally includes two pairs of single-ended I/O buffers with differential routing, ten single-ended data bits and I/O buffers. The data bits may be unidirectional. Example physical dimensions of the AD12 hardmacro 208 may be summarized as in the following TABLE 5:

TABLE 5

| ADR12 | | |
|---|---|---|
| | Width (I/O side) | Height (Core Side) |
| Digital Logic | 720 μm | 150 μm |
| IO | 720 μm | 500 μm |
| Dcap | 720 μm | 200 μm |
| Total | 720 μm | 850 μm |

The application of the various hardmacros in different memory interface applications may be summarized in the following TABLE 6:

TABLE 6

| | QDR-II/+ | DDR-II/+ | DDR2/3 | RLDRAM |
|---|---|---|---|---|
| Type | SIO | SIO | CIO | CIO |
| Read Address | ADR9, ADR12 | ADR9, ADR12 | ADR9, ADR12 | N/A | N/A |
| Read Data | DP18 | DP18 | DP18 | N/A | N/A |
| Write Address | ADR9, ADR12 | ADR9, ADR12 | ADR9, ADR12 | N/A | N/A |
| Write Data | DP18 | DP18 | N/A | N/A |
| Common Address | N/A | N/A | N/A | ADR9, ADR12 | ADR9, ADR12 |
| Common Data | N/A | N/A | DP18 | DP8 | DP18 |

Figure 4:
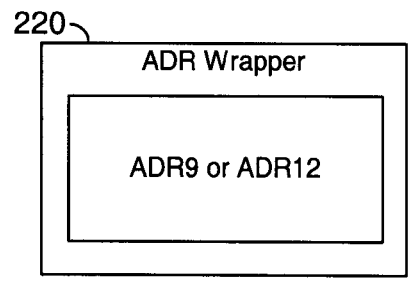
FIG. 4 is a block diagram illustrating an address wrapper in accordance with the present invention.

Referring to FIG. 4, a block diagram illustrating an ADR wrapper in accordance with the present invention is shown. The ADR wrapper 220 may encapsulate one or more ADR9 hardmacros 206, one or more ADR12 hardmacros 208, or one or more ADR9 hardmacros 206 and one or more ADR12 hardmacros 208. The ADR wrapper 220 may support various address bus widths. A number of examples are summarized in the following TABLE 7:

TABLE 7

| ADR9 | ADR12 | Supported Bus Width |
|---|---|---|
| 2 | 0 | 18 bits |
| 1 | 1 | 21 bits |
| 0 | 2 | 24 bits |
| 3 | 0 | 27 bits |
| 2 | 1 | 30 bits |
| 1 | 2 | 33 bits |
| 0 | 3 | 36 bits |
| 3 | 1 | 39 bits |
| 2 | 2 | 42 bits |
| 1 | 3 | 45 bits |
| 0 | 4 | 48 bits |

Figure 5:
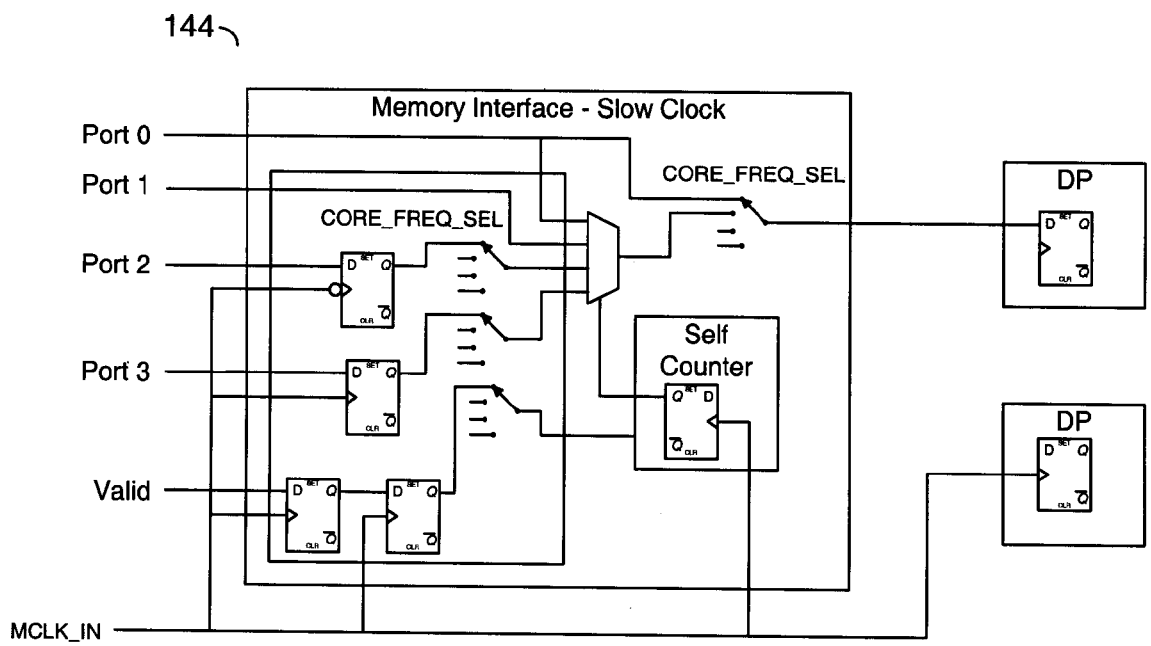
FIG. 5 is block diagram illustrating an optional clock interface of a physical layer architecture in accordance with the present invention.

Referring to FIG. 5, a block diagram illustrating an example of an optional slow clock circuit 144 in accordance with the present invention is shown. The slow clock circuit 144 may provides 2:1 or 4:1 data multiplexing or de-multiplexing when the memory controller logic is running at a clock rate of one-half or one-fourth of the 1× clock domain of the PHY 100. Depending upon the particular memory interface application being implemented, either (i) no data multiplexing or de-multiplexing logic may be instantiated, (ii) 2:1 data multiplexing or de-multiplexing logic may be instantiated, or (iii) 4:1 data multiplexing or de-multiplexing logic may be instantiated.

Figure 6:
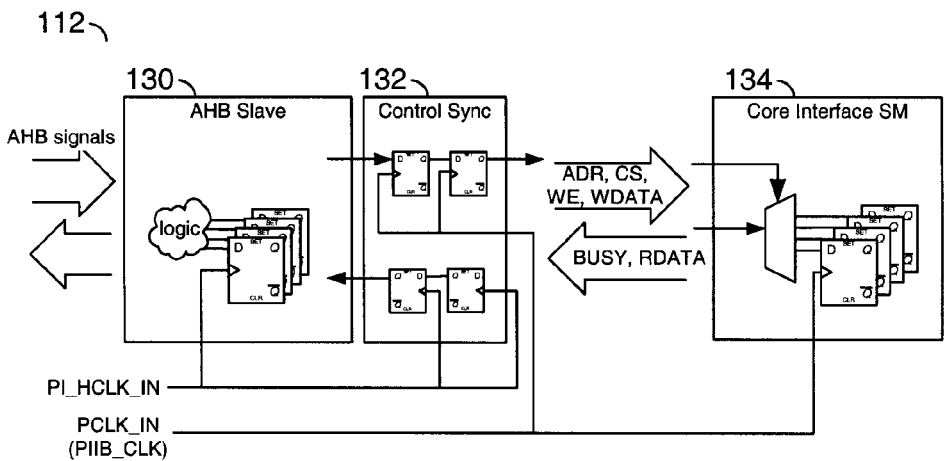
FIG. 6 is block diagram illustrating a control interface of a physical layer architecture in accordance with the present invention.

Referring to FIG. 6, a block diagram illustrating a control interface of a physical layer architecture in accordance with the present invention is shown. The control interface block 112 interfaces with controller logic block 104 and performs requested internal register read or write operations to or from all the low level components, such as ADR or DP hardmacro, FIFO logic, and other control logic residing inside the PhyTop 100. The block 130 may comprise a high-level functional protocol engine (e.g., AHB slave logic) to support an industry standard interface bus (e.g., AHB). The AHB slave logic may be optionally excluded by a Verilog parameter (e.g., P705_USE_AHB). For example, if the parameter value is set to 0 by the user, then the logic may be excluded from the PhyTop 100, and the controller interface logic 112 may use PhyTop proprietary register interface and protocol for device control. Otherwise, the AHB slave logic may be included in the PhyTop 100. The AHB slave logic 130 may be operated at a different frequency than the internal control logic of the PhyTop 100. In one example, the internal control logic of the PhyTop 100 may be operated at PCLK_IN frequency. The PCLK_IN frequency may be running at 100 MHz max for wide bus interface (e.g., 64-bit DQ bus). Because the AHB slave logic may be operated at a different frequency than the PhyTop internal control logic, the synchronization logic block 132 may be configured to synchronize the control signals from the AHB slave logic 130 to internal logic of the PhyTop 100 and vice versa.

Figure 9:
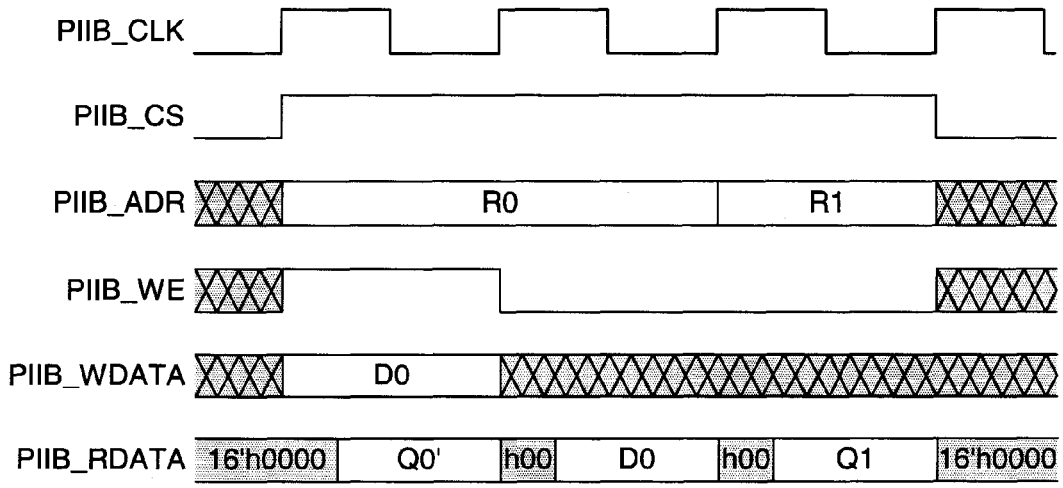
FIG. 9 is a timing diagram illustrating bus read and write timing in accordance with the present invention.

Control/bridging logic may also be included to translate the user transactions (e.g., an AHB bus read or write, or a proprietary register read or write) into PIIB (PhyTop internal interconnect bus) transactions. The PIIB transactions may be, for example, either a simple, single cycle, synchronous, register read or register write operations or two consecutive register write or read operations. An illustration of protocols for PIIB transactions is shown in FIG. 9.

Figure 7:
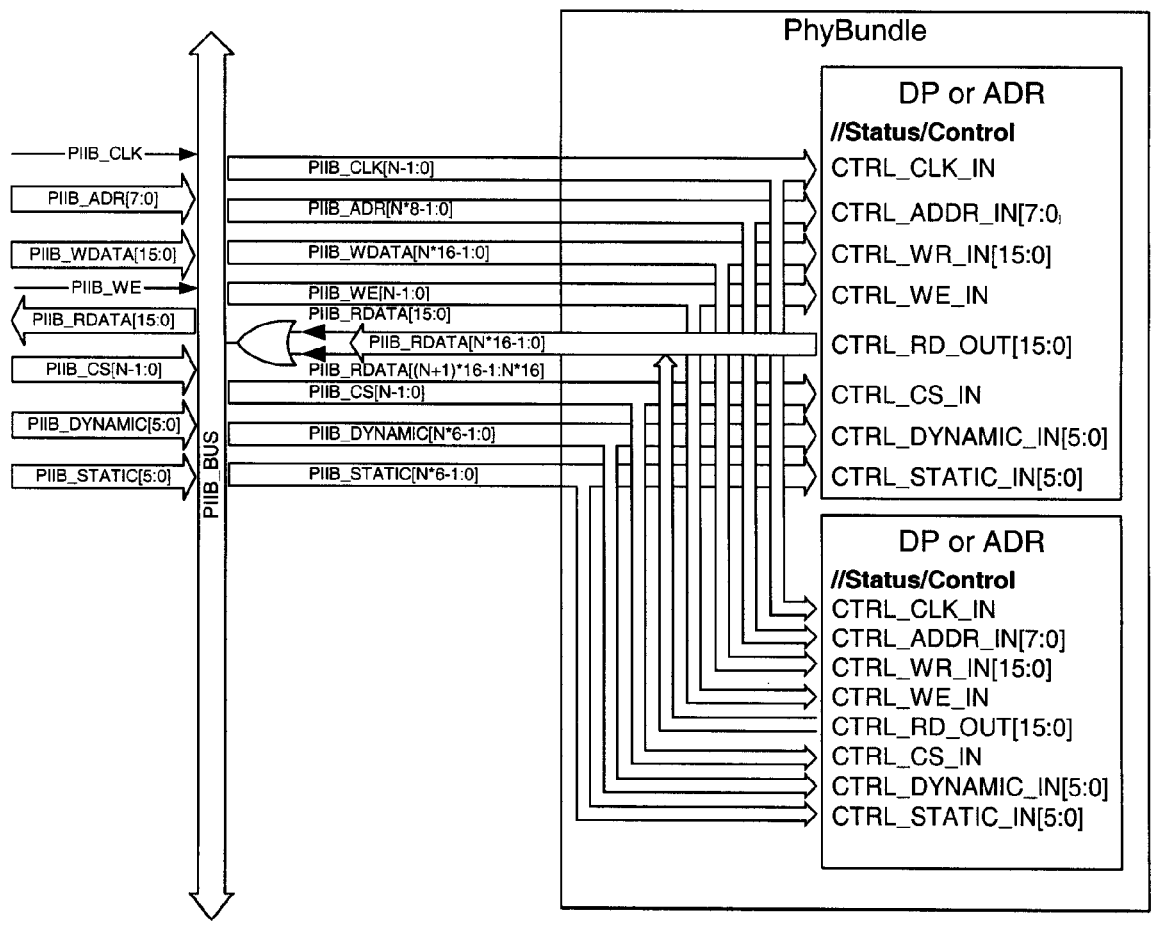
FIG. 7 is block diagram illustrating a control interface of a physical layer bundle block in accordance with the present invention.

Referring to FIG. 7, a block diagram illustrating a control interface of a physical layer bundle block in accordance with the present invention is shown. To facilitate communication between the macro blocks of the PHY 100, a synchronous interconnect bus (e.g., the PIIB) may be implemented. The PIIB may comprise a synchronous bus running at one-eighth of the CLK2X_IN frequency. The PIIB may have a maximum rate of, for example, 100 MHz. In one example, read data signals on slave devices may be ORed together. Write data, address, and read/write control signals may be fanned out to all slave devices. Each slave device may have a respective select signal. A single bus master (e.g., delay control module 116) with an implicit arbitration mechanism may be implemented. The PIIB may comprise a 16-bit unidirectional data bus and an 8-bit address bus.

The PIIB may comprise a number of signals (e.g., PIIB_CLK, PIIB_CS, PIIB_WE, PIIB_ADR, PIIB_WDATA, PIIB_RDATA, PIIB_DYNAMIC, and PIIB_STATIC). The signal PIIB_CLK may be received from a clock input (e.g., PCLK_IN). The signal PIIB_CLK may be used to time all bus transfers. In one example, all signal timings may be related to a rising edge of the signal PIIB_CLK. The signal PIIB_CS may be implemented as a chip select signal. The signal PIIB_CS may be received from the delay control block 116. Each PIIB slave may have a respective slave select signal. The signal PIIB_CS may be configured to indicate that the current transfer is intended for the selected slave. The signal PIIB_WE may be implemented as a write enable signal. The signal PIIB_WE may be received from the delay control block 116. The signal PIIB_WE may be a shared signal for all PIIB slaves. In one example, when the signal PIIB_WE is HIGH, the signal PIIB_WE may indicate a write transfer.

The signal PIIB_ADR may be implemented as an address signal. The signal PIIB_ADR may be received from the delay control block 116. In one example, the signal PIIB_ADR may be implemented as an 8-bit address bus. The signal PIIB_ADR may be implemented as a shared signal bus for all PIIB slaves. The signal PIIB_WDATA may be received from the delay control block 116. The signal PIIB_WDATA may be implemented, in one example, as a 16-bit write data bus. The signal PIIB_WDATA may be used to transfer data from the delay control module 116 to the DP/ADR hardmacros. The signal PIIB_WDATA may be implemented, in one example, as a shared bus for all PIIB slaves. The signal PIIB_RDATA may be implemented, in one example, as a 16-bit read data bus. The signal PIIB_RDATA may be used to transfer data from the DP/ADR hardmacros to the delay control module 116. The signal PIIB_RDATA may be implemented, in one example, as a shared bus for all PIIB slaves. In one example, the signal PIIB_RDATA may be valid as long as PIIB_CS signal remains HIGH.

The signal PIIB_DYNAMIC may be implemented, in one example, as a 6-bit bus that may be synchronous to the signal SCLK_IN (or SCLK). The signal PIIB_DYNAMIC may provide dynamic control to the DP or ADR hardmacro. In one example, bit 0 may be used for ODT control. For example, if bit 0 is set to 1, on die termination may be selected when the IO is not enabled for write. If BIST_MODE_IN is asserted ODT to the IO's may be controlled by the internal BIST logic. If SCAN_MODE_IN is asserted BIST_MODE_IN may be ignored.

In another example, bit 1 may be used for DQS GATING control (e.g., burst gating signal for read data strobes DQS or DM). Timing adjustments between DQS and DM gating may occur within the hardmacro. Bit 3,2 may implement a signal (e.g., DR_RANK) for DDR3 rank switching, write operations. Bit 3,2 may indicate which rank is being accessed during a write. Write rank selection updates may occur two cycles before the rising edge of DW_DQS_OEN_IN. Bit 5,4 may implement a signal (e.g., DR_RANK) for DDR3 rank switching, read operations. Bit 5,4 may indicate which rank is being accessed during a read. Read rank selection updates may occur one cycle before a rising edge of GATING.

The signal PIIB_STATIC may be implemented, in one example, as a 6-bit, static, configuration signal (or signals) to control the output signal levels of the ADR hardmacro and to configure certain signal pairs on the ADR hardmacro to generate periodic clocking function. This, in turn, may control the address bus of the memory interface since the signals are provided by the ADR hardmacro through the PhyTop 100. The signal, or signals, PIIB_STATIC may be statically connected to desired logic high or low level through, for example, a Verilog parameter (e.g., P705_ADR_IO_INIT_ST). In one example, the signal PIIB_STATIC may be configured as in the following examples.

Bit 1:0—reset state for bit ADR_OUT[11] and ADR_OUT[10]
00=Hi-Z, Hi-Z
01=0,1
10=1,0
11=0, Hi-Z
With PIIB_STATIC_IN[1:0]=11, Feed Back path is on for: ADR_OUT[11] as transmit, ADR_OUT[10] as receive.
Bit 3:2—reset state for bit ADR_OUT[5] and ADR_OUT[4]
00=Hi-Z, Hi-Z
01=0,1
10=1,0
11=0, Hi-Z
With PIIB_STATIC_IN[3:2]=11, Feed Back path is on for: ADR_OUT[5] as transmit, ADR_OUT[4] as receive.
Bit 5:4—reset state for bit ADR_OUT[9:6] and ADR_OUT[3:0]
00=All Hi-Z
01=All 0
10=All 1
11=ADR_OUT[9:7] 0, ADR_OUT[6] Hi-Z, ADR_OUT[3:0] 0.
With PIIB_STATIC_IN[5:4]=11, Feed Back path is on for: ADR_OUT[7] as transmit, ADR_OUT[6] as receive.

Figure 8:
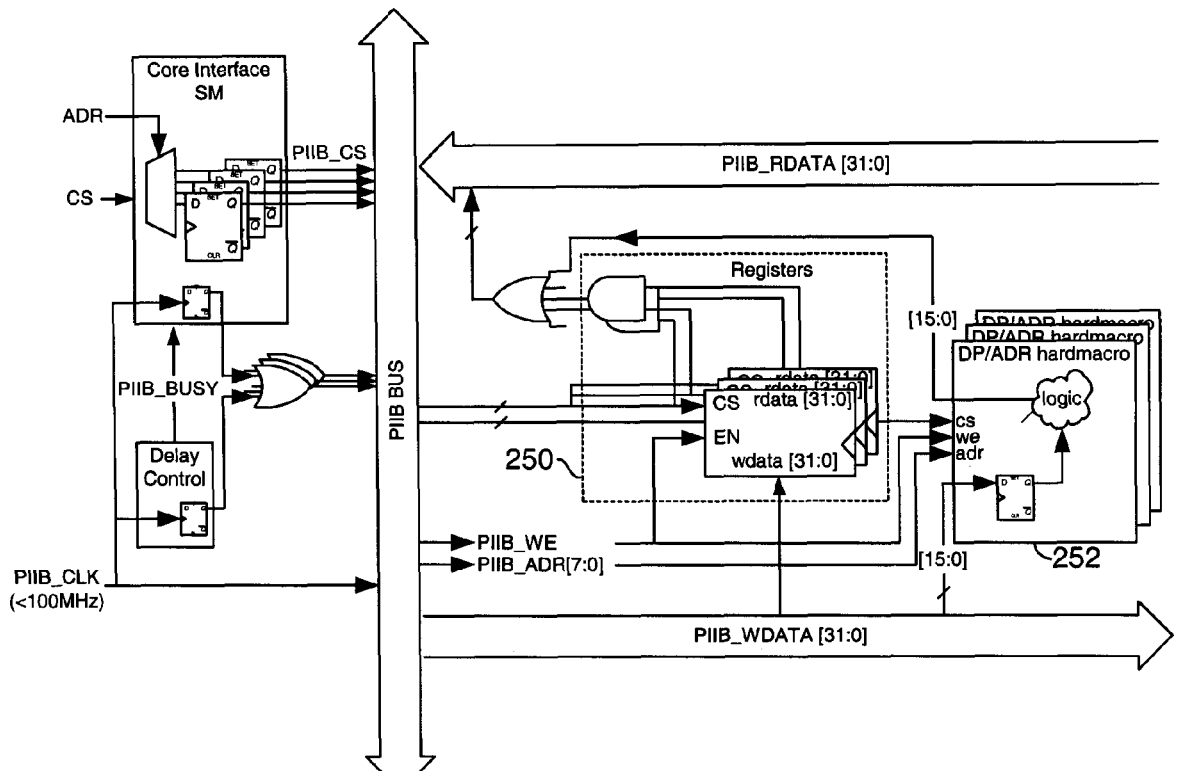
FIG. 8 is block diagram illustrating a bus architecture in accordance with the present invention.

Referring to FIG. 8, a block diagram illustrating a shared bus feature of the PIIB architecture in accordance with the present invention is shown. A register block 250 is "ORed" with DP/ADR hardmacro 252. The register block 250 and the DP/ADR hardmacro 252 may have a respective CS signal. The shared bus may by connected to the control interface block 112 illustrated in FIG. 6.

Referring to FIG. 9, a timing diagram illustrating PIIB read and write timing in accordance with the present invention is shown. In general, the PIIB may implement a simple register access communication protocol. Data transfer may be completed in a single cycle.

Figure 10:
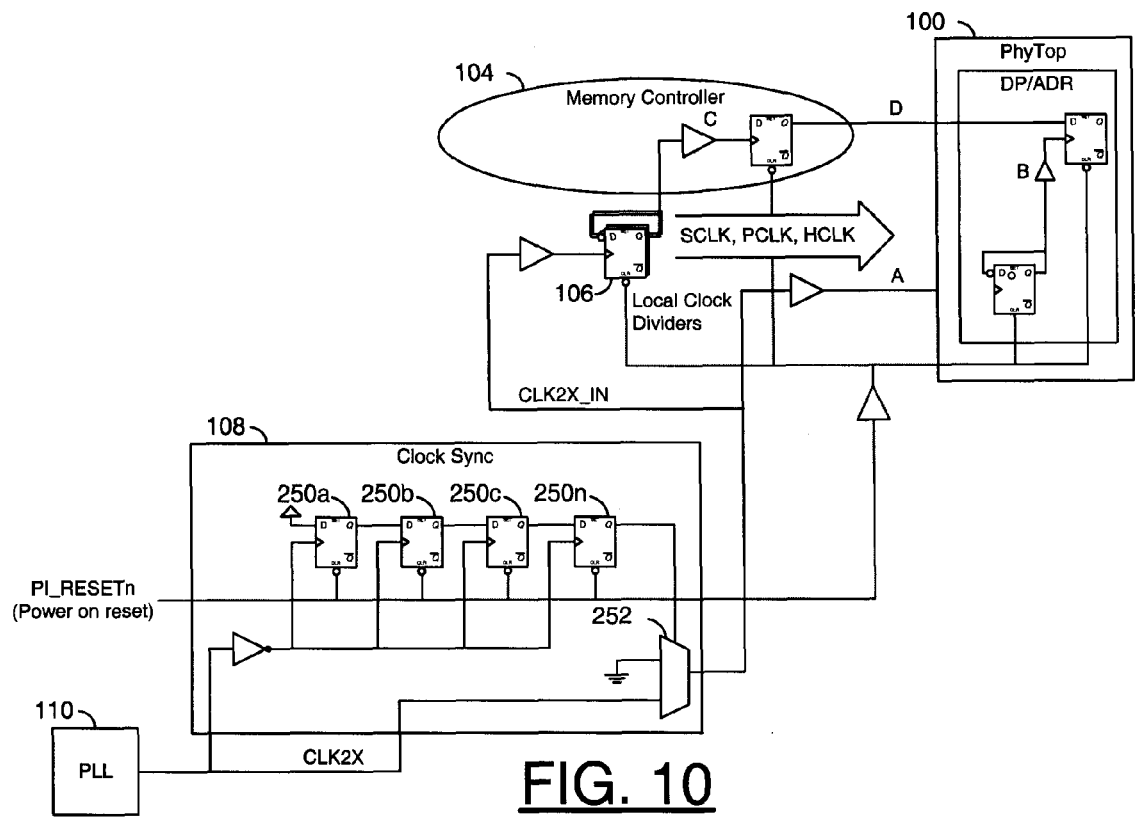
FIG. 10 is block diagram illustrating clocking scheme for a single channel in accordance with the present invention.

Referring to FIG. 10, a block diagram is shown illustrating a chip-level clocking scheme for a single channel that may be used with the PHY 100 at the chip-level. In one example, the clock synchronization block 108 may comprise a number of flip-flops 250a-250n and a multiplexer 252. The flip-flops 250a-250n may be connected in a serial chain. The flip-flops 250a-250 may each receive a power on reset signal at a control input (e.g., a CLR input) and a complement of the signal CLK2X_CML at a clock input. The flip-flop 250a may have a data (D) input configured to receive a LOW, or logic 0. An output (Q) of each of the flip-flops 250a-250(n-1) may be connected to a data input of the next flip-flop in sequence. An output of the flip-flop 250n may be presented to a control input of the multiplexer 252. A first input of the multiplexer 252 may receive the signal CLK2X, a second input of the multiplexer 252 may be configured to receive a LOW, or logic 0, and an output of the multiplexer may present the signal CLK2X_IN. A memory controller may be implemented in the logic 104.

Figure 11:
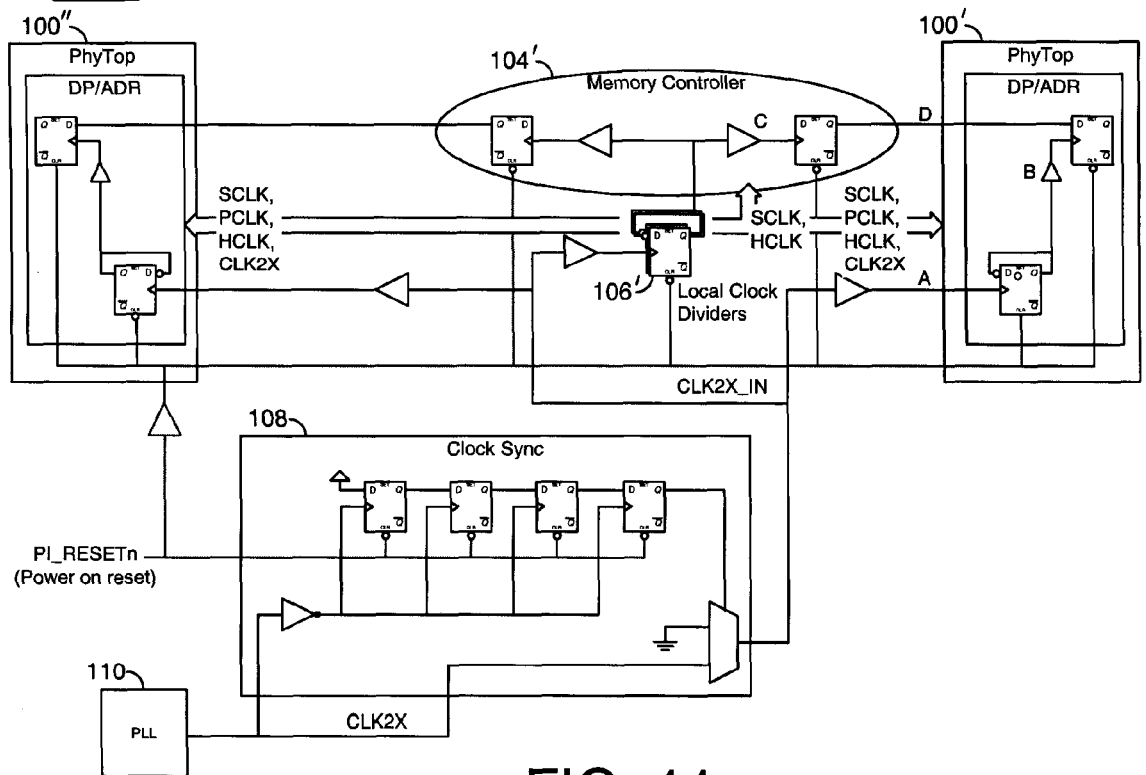
FIG. 11 is block diagram illustrating clocking scheme for multiple channels in accordance with the present invention.

Referring to FIG. 11, a block diagram is shown illustrating a chip-level clocking scheme for multiple channels that may be used with the PHY 100 at the chip-level. The clocking scheme for multiple channels may be implemented similarly to clocking scheme for the channel, except that the memory controller implemented in the logic 104 may be configured to control multiple instantiations of the PHY 100.

From an architectural point of view, the hardware components included in the PHY 100 may be divided into three major categories: (i) random logic functions that support different high-level functional protocols used by different memory interface applications; (ii) data path and address path macro function blocks that support different functionality and timing specifications associated with the different memory interface applications; (iii) I/O buffers and related on-die decoupling capacitors that support different electrical signaling specifications used by the different memory interface applications. The random logic functions that support different memory interface applications may be grouped into two functional groups: write path functions (described in more detail below in connection with FIGS. 12-16) and read path functions (described in more detail below in connection with FIG. 17).

Figure 12:
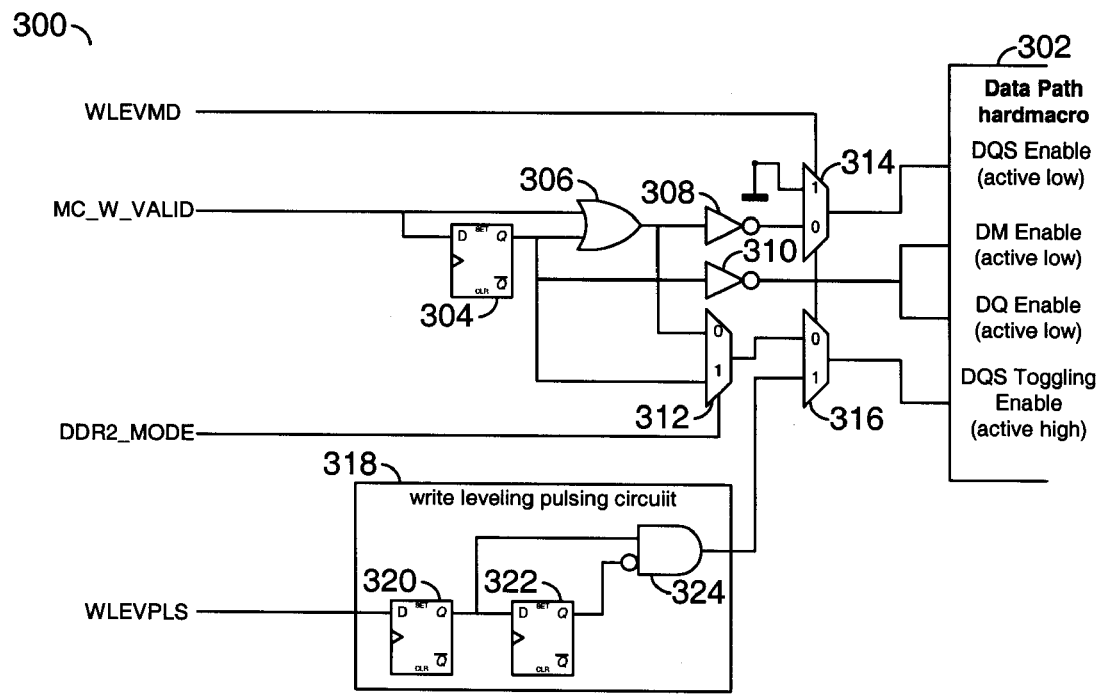
FIG. 12 is a block diagram illustrating an example write path logic in accordance with the present invention.

Referring to FIG. 12, a block diagram illustrating an example write path logic 300 in accordance with the present invention is shown. The write path logic 300 may be configured to support x8 type memory devices. In one example, the write path logic 300 may be used to implement DDR2/3 SDRAM interfaces. The write path logic 300 may be duplicated for each instance of data path hardmacro for meeting high-speed (e.g., 400 MHz) timing specifications.

The write path logic 300 may have a first input that may receive a signal (e.g., WLEVMD), a second input that may receive a signal (e.g., MC_W_VALID), a third input that may receive a signal (e.g., DDR_MODE) and a fourth input that may receive a signal (e.g., WLEVPLS). The signal WLEVMD may be configured to indicate a write leveling mode. The signal MC_W_VALID may be implemented as a write control signal. The signal WLEVPLS may be implemented as a write leveling pulse signal. The signals WLEVMD, MC_W_VALID and WLEVPLS may be received from the control register logic block 118. The signal WLEVMD, MC_W_VALID and WLEVPLS generally run a low speed and may be considered as static configuration or control signals.

In one example, the signal MC_W_VALID may be asserted (e.g., set to HIGH, or a logic 1) to initiate a valid write transaction to the PHY 100. The signal MC_W_VALID may be configured to remain asserted for a number of contiguous cycles of write data being sent to a memory device. For example, in QDR or DDR-II SRAM port applications, the signal MC_W_VALID may be asserted on the same cycles as the write data. In a DDR2 or RLDRAM-II single port application, the signal MC_W_VALID may be asserted one cycle before the write data is sent. In an SDRAM application where the SDRAM controller has a DFI interface, the signal may comprise the dfi_wrdata_en signal.

The write path logic 300 may have a first output that may present a first enable signal, a second output that may present a second enable signal and a third output that may present a third enable signal. When the write path logic 300 is implemented to support an x8 memory device application, the first enable signal may be presented to a DQS enable input of the data path hardmacro 302, the second enable signal may be presented to a DM enable input and a DQ enable input of the data path hardmacro 302, and the third enable signal may be presented to a DQS toggling enable input of the data path hardmacro 302. In one example, the DQS enable, DM enable and DQ enable inputs may be active low and the DQS toggling enable input may be active high.

In one example, the write path logic 300 may comprise a block (or circuit) 304, a block (or circuit) 306, a block (or circuit) 308, a block (or circuit) 310, a block (or circuit) 312, a block (or circuit) 314, a block (or circuit) 316 and a block (or circuit) 318. The block 304 may be implemented, in one example, as a register (or flip-flop). The block 304 may be implemented, in one example, as an OR gate. The blocks 308 and 310 may be implemented, in one example, as inverters. The blocks 312, 314 and 316 may be implemented, in one example, as multiplexers. The block 318 may be implemented, in one example, as a write leveling pulsing circuit.

The signal MC_W_VALID may be presented to a data input (e.g., a D input) of the block 304 and a first input of the block 306. A data output (e.g., a Q output) of the block 304 may be presented to a second input of the block 306, an input of the block 310 and a first data input of the block 312. An output of the block 306 may be presented to an input of the block 308 and a second data input of the block 312. The signal DDR2_MODE may be presented to a control input of the block 312.

The signal WLEVMD may be presented to a control input of the block 314 and a control in put of the block 316. A first data input of the block 314 may be configured to receive a low, or logic 0 signal. A second data input of the block 314 may receive an output of the block 308. An output of the block 314 may present the first enable signal. An output of the block 310 may present the second enable signal. An output of the block 312 may be presented to a first data input of the block 316. The signal WLEVPLS may be presented to an input of the block 318. An output of the block 318 may be presented to a second data input of the block 316. In one example, the block 318 may comprise an edge detector. For example, the block 318 may be configured to generate a single cycle pulse in response to a transition of the signal WLEVPLS from a LOW state to a HIGH state. An output of the block 316 may present the third enable signal.

In one example, the block 318 may comprise a block (or circuit) 320, a block (or circuit) 322, and a block (or circuit) 324. The blocks 320 and 322 may be implemented, in one example, as registers (or D-type flip-flops). The block 324 may be implemented, in one example, as an AND gate. In one example, the AND gate 324 may be implemented with one inverting (or active low) input and one non-inverting (or active high) input. The signal WLEVPLS may be presented to a data (D) input of the block 320. An output (e.g., a Q output) of the block 320 may be presented to a data input of the block 322 and the non-inverting (or active high) input of the block 324. An output (e.g., a Q output) of the block 322 may be present to the inverting (or active low) input of the block 324. An output of the block 324 may present the signal received by the second data input of the block 316. The registers 304, 320 and 322 generally run at a 1× clock rate. Input signals presented to the registers 304, 320 and 322 generally should be synchronized before being present to the D-inputs of the registers 304, 320 and 322.

Figure 13:
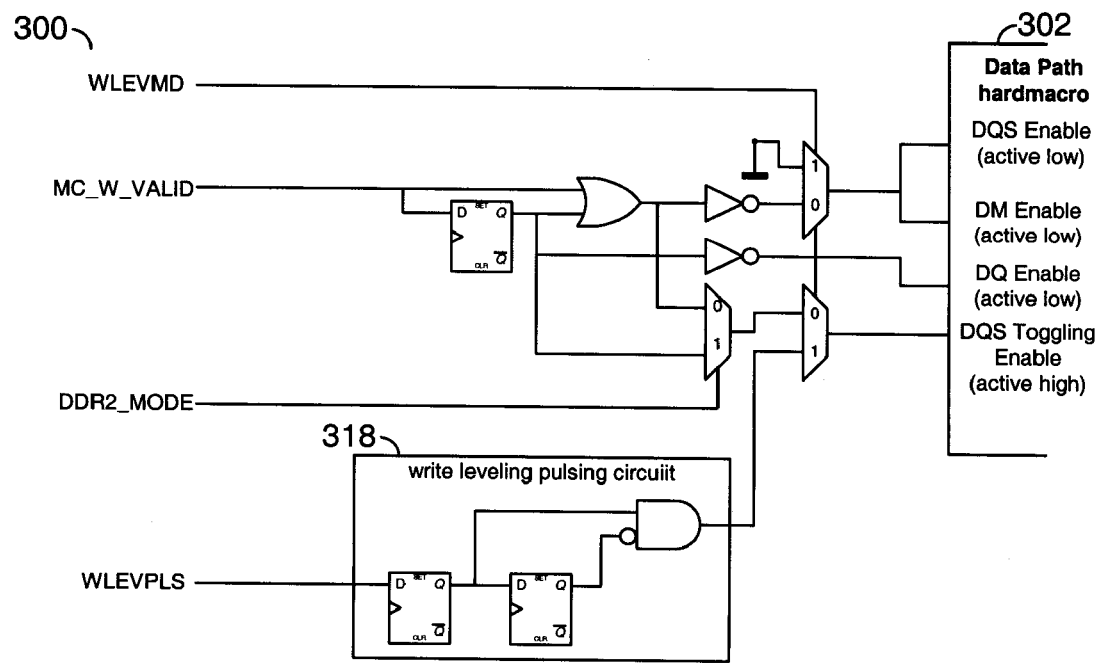
FIG. 13 is a block diagram illustrating another example write path logic in accordance with the present invention.

Referring to FIG. 13, a block diagram illustrating the write path logic 300 of FIG. 12 configured to support an x4 type memory device in accordance with the present invention is shown. In the x4 type memory device application, the first enable signal may be presented to the DQS enable input and the DM enable input of the data path hardmacro 302, the second enable signal may be presented to the DQ enable input of the data path hardmacro 302, and the third enable signal may be presented to the DQS toggling enable input of the data path hardmacro 302. In one example, the DQS enable, DM enable and DQ enable inputs may be active low and the DQS toggling enable input may be active high.

Figure 14:
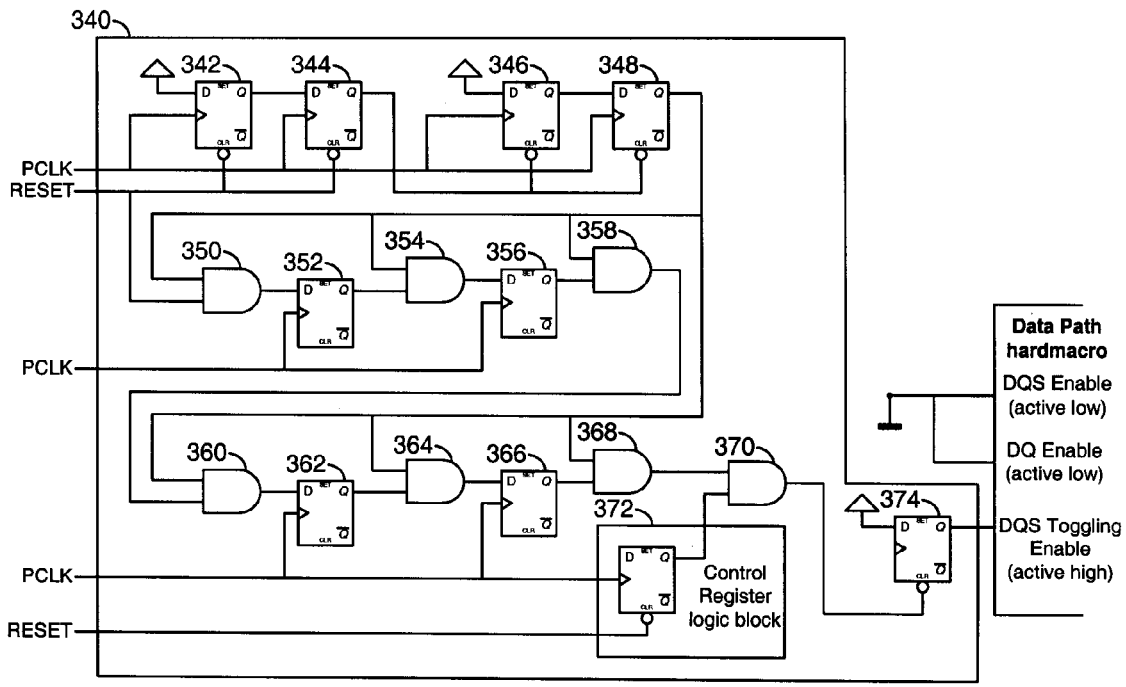
FIG. 14 is a block diagram illustrating still another example write path logic in accordance with the present invention.

Referring to FIG. 14, a block diagram illustrating an example write path logic 340 implemented in a QDR-II+ (separate IO) application in accordance with the present invention is shown. The write path logic 340 generally provides a self-timed circuit configured to delay de-assertion of a reset signal presented to an I/O buffer in the PCLK domain. A reset signal (e.g., RESET) may be delayed, in one example, by eight cycles. The delay generally ensures the input signals are in valid logic states before de-assertion of the reset signal.

The writer data path 340 may have a first input that may receive the signal PCLK and a second input that may receive the signal RESET. The signal RESET may be implemented as an external reset signal. The write data path logic 340 may have an output that may present a signal to the DQS toggling enable input of a data path hardmacro. The DQS port may be used as DK/DKN ports for SRAM application. DK/DKN are continuous clocks and, therefore, DQS toggling enable signal may set to the active state after reset is de-asserted. The DQ and DQS enable inputs of the data path hardmacro may be tied to low, or logic 0, because QDR-II+ SRAM has a dedicated port for write data and, therefore, the write data path may always be configured in output mode.

The writer data path 340 may comprise a block (or circuit) 342, a block (or circuit) 344, a block (or circuit) 346, a block (or circuit) 348, a block (or circuit) 350, a block (or circuit) 352, a block (or circuit) 354, a block (or circuit) 356, a block (or circuit) 358, a block (or circuit) 360, a block (or circuit) 362, a block (or circuit) 364, a block (or circuit) 366, a block (or circuit) 368, a block (or circuit) 370, a block (or circuit) 372 and a block (or circuit) 374. The blocks 342, 344, 346, 348, 352, 356, 362, 366, 372 and 374 may be implemented as, in one example, registers (or D-type flip-flops). The blocks 350, 354, 358, 360, 364, 368 and 370 may be implemented as, in one example, AND gates. The registers 352, 356, 362, and 366 may be meta-stable hardened to ensure reliability of the reset signal. The register 372 may be implemented as one of the registers in the control register block 118.

The signal PCLK may be presented to a clock input of each of the registers 342, 344, 346, 348, 352, 356, 362, 366 and 372. The signal RESET may be presented to a first input of the AND gate 350 and an asynchronous clear input of each of the registers 342, 344 and 372. A data input of the register 342 may be tied high (or to a logic 1). An output (e.g., Q) of the register 342 may be connected to a data input of the register 344. An output (e.g., Q) of the register 344 may be presented to an asynchronous clear input of the registers 346 and 348.

A data input of the register 346 may be tied high (or to a logic 1). An output (e.g., Q) of the register 346 may be connected to a data input of the register 348. An output (e.g., Q) of the register 348 may be presented to a second input of the AND gate 350 and a first input of the AND gates 354, 358, 360, 364 and 368. An output of the AND gate 350 may be presented to a data input of the register 352. An output (e.g., Q) of the register 352 may be presented to a second input of the AND gate 354. An output of the AND gate 354 may be presented to a data input of the register 356. An output (e.g., Q) of the register 356 may be presented to a second input of the AND gate 358. An output of the AND gate 358 may be presented to a second input of the AND gate 360.

An output of the AND gate 360 may be presented to a data input of the register 362. An output (e.g., Q) of the register 362 may be presented to a second input of the AND gate 364. An output of the AND gate 364 may be presented to a data input of the register 366. An output (e.g., Q) of the register 366 may be presented to a second input of the AND gate 368. An output of the AND gate 368 may be presented to a first input of the AND gate 370. An output (e.g., Q) of the register 372 may be presented to a second input of the AND gate 370. An output of the AND gate 370 may be presented to an asynchronous clear input of the register 374. A data input of the register 374 may be tied high (or to a logic 1). An output (e.g., Q) of the register 374 may present the signal presented to the DQS toggling enable input of the datapath hardmacro.

Figure 15:
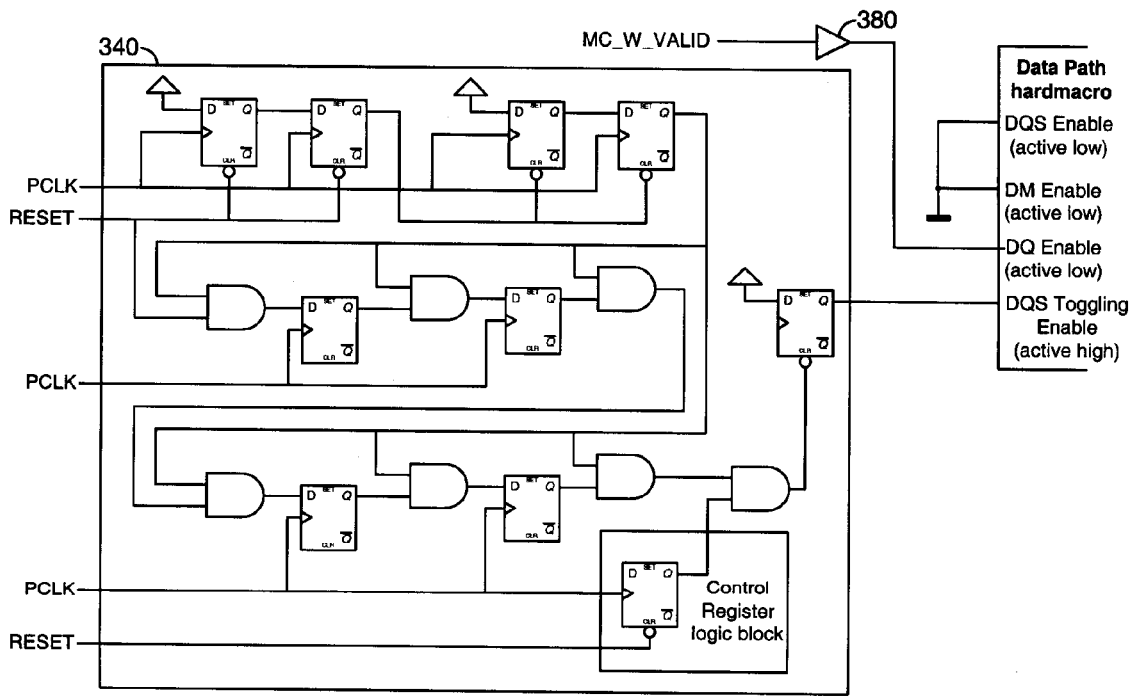
FIG. 15 is a block diagram illustrating yet another example write path logic in accordance with the present invention.

Referring to FIG. 15, a block diagram illustrating the write path logic 340 implemented in a RLDRAM-II+ application in accordance with the present invention is shown. The write data path in the RLDRAM-II+ application may be configured similarly to the QDR-II+application, except that the DM and DQS enable inputs of the datapath hardmacro are tied low, or logic 0 and the DQ enable input of the datapath hardmacro receives a complement of the signal MC_W_VALID. For example, the signal MC_W_VALID may be present to an input of an inverter 380 and an output of the inverter 380 may be connected to the DQ enable input of the datapath hardmacro. The DM and DQS enable signals are tied to low, or logic 0, because RLDRAM-II+ SRAM has a dedicated port for write data and, therefore, the write data path may always be configured in output mode.

Figure 16:
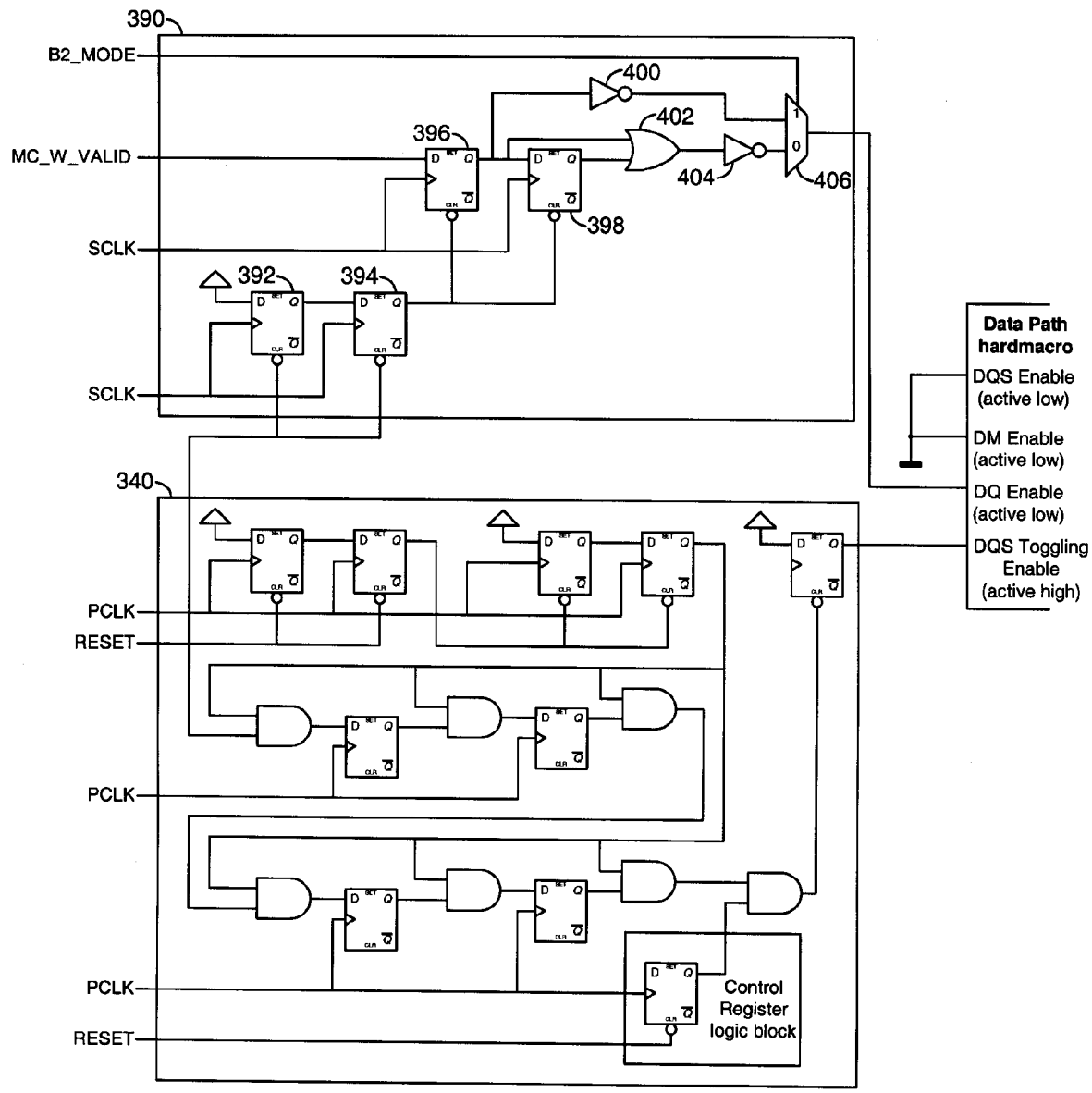
FIG. 16 is a block diagram illustrating still a fifth example write path logic in accordance with the present invention.

Referring to FIG. 16, a block diagram illustrating the write path logic 340 implemented in a DDR-II+ (common IO) application in accordance with the present invention is shown. The write data path in the DDR-II+ application may be configured similarly to the RLDRAM-II+ application, except that a block (or circuit 390 may be configured to generate the DQ enable signal presented to the DQ enable input of the data path hardmacro based upon the signal MC_W_VALID, the signal SCLK, the signal RESET and a burst mode control signal (e.g., B2_MODE). The DM and DQS enable signals may be tied to low, or logic 0, because DDR-II+ SRAM has a dedicated port for write data and, therefore, the write data path may always be configured in output mode.

In one example, the block 390 may comprise a register 392, a register 394, a register 396, a register 398, a gate 400, a gate 402, a gate 404, and a gate 406. The registers 392-398 may be implemented, in one example, as D-type flip-flops with asynchronous clear inputs. The gate 400 may be implemented, in one example, as an inverter. The gate 402 may be implemented, in one example, as a two-input OR gate. The gate 404 may be implemented, in one example, as an inverter. The gate 406 may be implemented, in one example, as multiplexer.

The signal SCLK may be presented to a clock input of the registers 392-398. The signal RESET maybe presented to the asynchronous clear inputs of the registers 392 and 394. A data input of the register 392 may be tied high (or logic 1). An output (e.g., Q) of the register 392 may be connected to an data input of the register 394. An output (e.g., Q) of the register 394 may be connected to the asynchronous clear inputs of the registers 396 and 398. The signal MC_W_VALID may be presented to a data input of the register 396. An output (e.g., Q) of the register 396 may be presented to a data input of the register 398, an input of the gate 400, and a first input of the gate 402. An output (e.g., Q) of the register 398 may be presented to a second input of the gate 402. An output of the gate 402 may be presented to an input of the gate 404. An output of the gate 400 may be present to a first input of the gate 406. An output of the gate 404 may be present to a second input of the gate 406. The signal B2_MODE may be presented to a control input of the gate 406. In one example, the gate 406 may be configured to present (i) the output of the gate 400 to the DQ enable input of the datapath hardmacro when the signal B2_MODE is high, or a logic 1, and (ii) the output of the gate 404 to the DQ enable input of the datapath hardmacro when the signal B2_MODE is low, or a logic 0.

Configurability that is functionally exclusive to different memory interfaces may be parameterized (e.g., by Verilog 2000 RTL compile options) to include and connect related random logic circuitry to the low-level data path and address path macro functions. Configurability that is related to interface signal protocol function of each memory interface may be implemented by random logic functions controlled by, for example, registers. Configurability that is related to interface signal protocol function of each memory interface may be programmable by the user after the PHY 100 exits from a power up reset state. RTL code may be generated for the write path random logic described in connection with FIGS. 12-16 as shown by the following example:

```
generate
   reg [NUM_OF_DP - 1 : 0] mc_w_valid_ff;
   wire [NUM_OF_DP - 1 : 0] mc_w_valid_delayed;
   // reg DW_DK_IN_ff;
   if (P705_MEM_TYPE == 0) begin //{ DDR2/3 SDRAM
         assign SLOW_W_PDQ = MC_W_PDQ;
         assign SLOW_W_PDM = MC_W_PDM;
         assign SLOW_W_NDQ = MC_W_NDQ;
         assign SLOW_W_NDM = MC_W_NDM;
         //assign SLOW_W_DQS_OEn = ~MC_W_VALID ;
         //assign SLOW_W_DQS_OEn = write_leveling_mode_synced? {
NUM_OF_DP {1'b0 }} : ~MC_W_VALID ;
         assign SLOW_W_DQS_OEn = write_leveling_mode_synced? {
NUM_OF_DP {1'b0 }} : ~mc_w_valid_delayed ;
             // One cycle shorter than SLOW_W_DQS_OEn
             assign SLOW_W_DQDM_OEn = ~mc_w_valid_ff ;
             // In DDR2, DQS turned on timing is the same as DQ
signal.
             // In DDR3, DQS need to be turned on one cycle earlier.
             assign SLOW_W_DQS_SW = write_leveling_mode_synced ?
{NUM_OF_DP{wr_level_pulse}} : (ddr2_mode_synced) ? mc_w_valid_ff :
mc_w_valid_delayed;
             assign SLOW_W_DM_DQS_SW = MEM_X4_SEL? SLOW_W_DQS_SW :
dw_dm_oen_in ;
             assign dw_dm_oen_in = MEM_X4_SEL ? SLOW_W_DQS_OEn :
SLOW_W_DQDM_OEn;
             // new circuit
             always @(posedge SCLK_IN or negedge sclk_rstn) begin
                 if (!sclk_rstn) begin
                    mc_w_valid_ff <= #0.1 {NUM_OF_DP {1'b0}} ;
                 end else begin
                    if (clock_gating_en) begin
                       mc_w_valid_ff <= #0.1 MC_W_VALID ;
                    end
                 end
             end
      assign mc_w_valid_delayed = mc_w_valid_ff | MC_W_VALID ;
   end else if (P705_MEM_TYPE == 1) begin //{ QDR-II x18
      reg [NUM_OF_DP - 1 : 0] DW_DK_IN_ff;
      assign SLOW_W_PDQ = MC_W_PDQ;
      assign SLOW_W_PDM = MC_W_PDM;
      assign SLOW_W_NDQ = MC_W_NDQ;
      assign SLOW_W_NDM = MC_W_NDM;
      assign SLOW_W_DQS_OEn = {NUM_OF_DP {1'b0}} ;
      assign SLOW_W_DQDM_OEn = {NUM_OF_DP {1'b0}} ;
      assign dw_dm_oen_in = {NUM_OF_DP {1'b0}} ;
      assign SLOW_W_DQS_SW = DW_DK_IN_ff ; // Turn on DK/DKn
      assign SLOW_W_DM_DQS_SW = DW_DK_IN_ff ;
      always @(posedge pclk or negedge RSTN_IO_w) begin //{
         if (~RSTN_IO_w)
            DW_DK_IN_ff <= #0.1 {NUM_OF_DP {1'b0}};
         else
            DW_DK_IN_ff <= #0.1 {NUM_OF_DP {1'b1}};
         end //}
   end //}
//---------------------------------------------------------
// Common configuration for the following applications:
// DDR-II SRAM x18, CIO
// RLDRAM-II x18, CIO
//---------------------------------------------------------
   else if ((P705_MEM_TYPE == 2) || (P705_MEM_TYPE == 4))
      begin //{ DDR-II or RLDRAM, x18, CIO
         reg [NUM_OF_DP - 1 : 0] dq_oen_ff ;
         reg [NUM_OF_DP - 1 : 0] dq_oen_ff2 ;
         wire [NUM_OF_DP - 1 : 0] dq_oen_ff_w ;
```

-continued

```
        reg [NUM_OF_DP - 1 : 0] DW_DK_IN_ff;
        assign SLOW_W_PDQ = MC_W_PDQ;
        assign SLOW_W_PDM = MC_W_PDM;
        assign SLOW_W_NDQ = MC_W_NDQ;
        assign SLOW_W_NDM = MC_W_NDM;
        assign SLOW_W_DQS_OEn = {NUM_OF_DP {1'b0}} ; //DK or DKn
are always in output mode.
        // 1 cycle latency match with data phase for DDRII SRAM,
no latency for RLDRAM
        assign SLOW_W_DQDM_OEn = (P705_MEM_TYPE == 4) ?
~MC_W_VALID : (b2_mode_synced)? ~dq_oen_ff : ~dq_oen_ff_w;
        assign dw_dm_oen_in = {NUM_OF_DP {1'b0}} ; // DM is
always in output mode.
        // DQ OEn generation
    always @(posedge SCLK_IN or negedge sclk_rstn) begin //{
        if (~sclk_rstn) begin
            dq_oen_ff <= #0.1 {NUM_OF_DP {1'b0}};
            dq_oen_ff2 <= #0.1 {NUM_OF_DP {1'b0}};
        end else begin
            dq_oen_ff <= #0.1 MC_W_VALID ;
            dq_oen_ff2 <= #0.1 dq_oen_ff ;
        end
    end //}
        assign dq_oen_ff_w = dq_oen_ff2 | dq_oen_ff ;
        //-----------------------------------------
        // Turn on DK/DKn after reset is released
        //-----------------------------------------
        always @(posedge pclk or negedge RSTN_IO_w) begin //{
            if (~RSTN_IO_w)
                DW_DK_IN_ff <= {NUM_OF_DP {1'b0}};
            else
                DW_DK_IN_ff <= {NUM_OF_DP {1'b1}};
        end //}
        assign SLOW_W_DQS_SW = DW_DK_IN_ff ; // Turn on DK/DKn
        //-----------------------------------------
        // SLOW MEM CLK - yet to implement.
        end else begin //{
        reg [NUM_OF_DP- 1: 0] DW_DK_IN_ff;
        assign SLOW_W_PDQ = MC_W_PDQ;
        assign SLOW_W_PDM = MC_W_PDM;
        assign SLOW_W_NDQ = MC_W_NDQ;
        assign SLOW_W_NDM = MC_W_NDM;
        assign SLOW_W_DQS_OEn = {NUM_OF_DP {1'b0 }};
        assign SLOW_W_DQDM_OEn = {NUM_OF_DP {1'b0}} ;
        assign dw_dm_oen_in = {NUM_OF_DP {1'b0}} ;
        assign SLOW_W_DQS_SW = DW_DK_IN_ff ; // Turn on DK/DKn
        assign SLOW_W_DM_DQS_SW = DW_DK_IN_ff ;
        //-----------------------------------------
        // Turn on DK/DKn after reset is released
        //-----------------------------------------
        always @(posedge pclk or negedge RSTN_IO_w) begin //{
            if (~RSTN_IO_w)
                DW_DK_IN_ff <= {NUM_OF_DP {1'b0}};
            else
                DW_DK_IN_ff <= {NUM_OF_DP {1'b1}};
        end //}
    end //}
endgenerate
```

Figure 17:
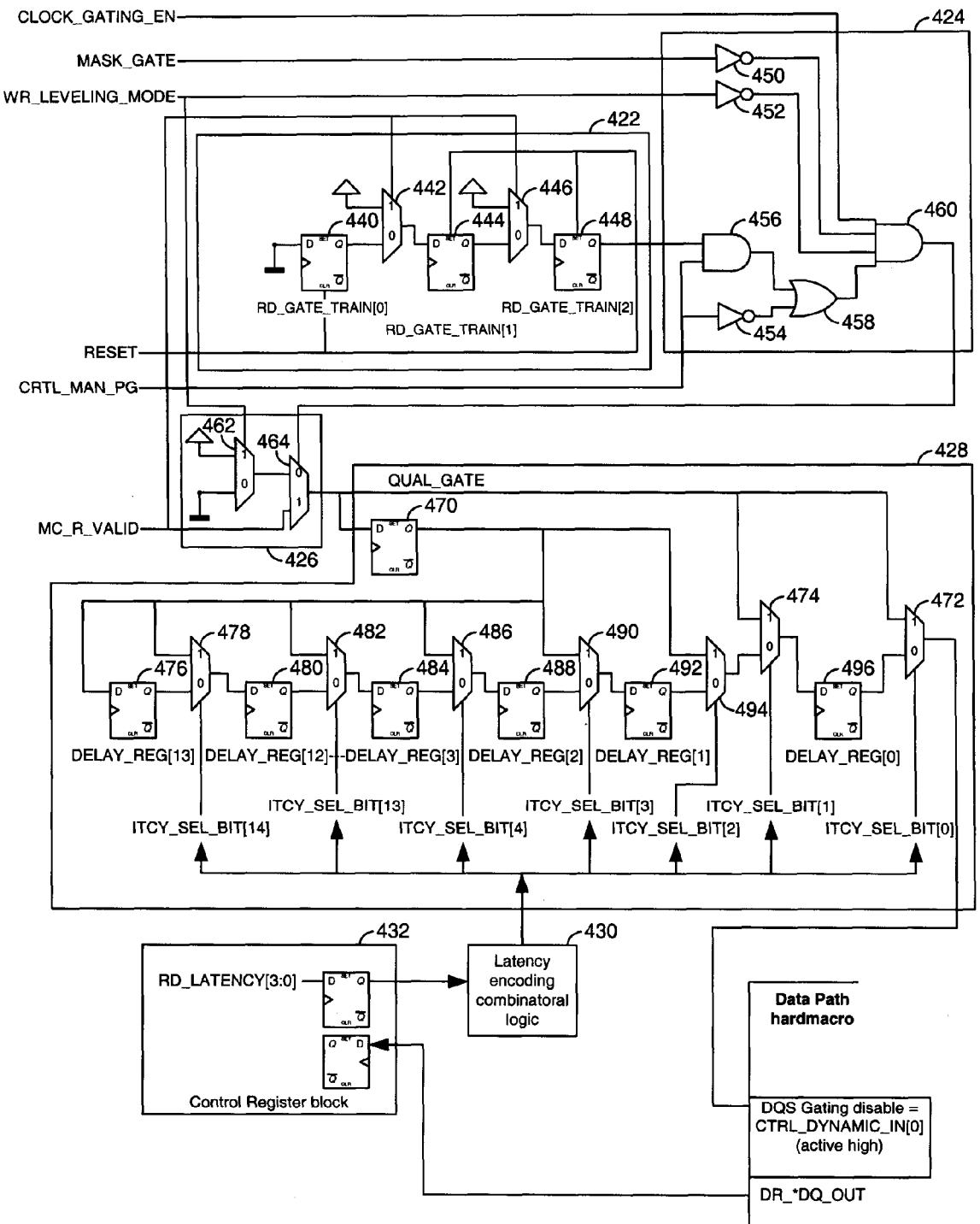
FIG. 17 is a block diagram illustrating an example read path logic in accordance with the present invention.

Referring to FIG. 17, a block diagram illustrating an example read path logic 420 in accordance with the present invention is shown. The read path logic 420 generally supports the DDR2/3 SDRAM interface applications. The read path logic 420 may comprise a block (or circuit) 422, a block (or circuit) 424, a block (or circuit) 426, a block (or circuit) 428, a block (or circuit) 430 and a block (or circuit) 432. The block 422 may be implemented as a single cycle pulse generator. The block 424 may be implemented as a DQS gating training mode control signal generator. The block 426 may be implemented as a DQS gating write leveling mode control signal generator. The block 428 may be implemented as a programmable delay line. The block 430 may be implemented as latency encoding combinatorial logic. The block 432 may be implemented as a write leveling mode feedback data capture block.

In DQS gating training mode, the block 422 may generate a single cycle pulse for a DQS gating training circuit inside the datapath hardmacro. The signal RD_GATE_TRAIN[2:0] may be generated by, in one example, a registers loaded with the 3'b011 bit pattern. The pattern may be shifted out upon assertion of the MC_R_VALID signal The shifted out bit pattern will create a single cycle pulse of DQS gating disable signal to the datapath hardmacro.

In write leveling mode, the block 426 bay be configured to disable the DQS gating inside the datapath hardmacro because the DQS signal is constantly driven by DDR2/3 DRAM device. There is no need to gate off the tri-state signal. The block 428 generally comprises a programmable delay line configured to provide variable latency (e.g., from zero to fourteen cycles at the PHY 100 level+4 cycles inside the datapath hardmacro) of opening/disabling the gating to the read DQS signal. The block 428 allows the PHY 100 to accommodate different read latency specifications for DDR2/3 SDRAM devices. In write leveling mode, the block 432 is configured to capture the DQ feedback data driven by the DDR2/3 SDRAM devices.

The read path logic 420 may be duplicated for each instance of data path hardmacro in order to meet timing specifications at high speed (e.g. 400 MHz). The read path logic 420 may be omitted for the QDRII+ or RLDRAM-II+ interfaces because the read clock (QK/QKN) is continuous and a source synchronous valid signal is provided by the memory devices to indicate valid data. Therefore, the read path logic 420 is not generally included in a parameterization of RTL code for the PHY 100.

The block 422 may have a first input that may receive a signal (e.g., RESET), a second input that may receive a signal (e.g., MC_R_VALID), a third input that may receive a signal (e.g., RD_GATE_TRAIN[2:0]) and an output that may present a single cycle pulse signal. The signal RESET may be implemented as a reset signal. The signal MC_R_VALID may be implemented, in one example, as a read handshake signal. In one example, the signal MC_R_VALID may be set high (or logic 1) when the PHY 100 transfers valid data to the core. The signal RD_GATE_TRAIN[2:0] generally contains a bit pattern (e.g., 3'b011) for generating the single cycle pulse signal that may be use to generate the DQS gating disable signal presented to the datapath hardmacro. The block 422 may be configured to shift out the pattern specified by the signal RD_GATE_TRAIN[2:0] upon assertion of the signal MC_R_VALID (e.g., a transition of the signal MC_R_VALID from low, or logic 0, to high, or logic 1).

The block 424 may have a first input that may receive a signal (e.g., CLK_GATING_EN), a second input that may receive a signal (e.g., MASK_GATE), a third input that may receive a signal (e.g., WR_LEVELING_MODE), a fourth input that may receive a signal (e.g., CTRL_MAN_PG), a fifth input that may receive the single cycle pulse signal from the block 422 and an output that may present a DQS gating related control signal. The DQS gating related control signal may be presented to a first input of the block 426.

The block 426 may have a second input that may receive the signal WR_LEVELING_MODE, a third input that may receive a the signal MC_R_VALID and an output that may present a signal (e.g., QUAL_GATE). The signal QUAL_GATE may be presented to a first input of the block 428. The block 428 may have a second input that may receive a signal from an output of the block 430 and an output that may present a DQS gating disable control signal to an input of the data path hardmacro. The block 430 may have an input that may receive a signal from an output of the block 432. The block 432 may have an input that may receive a DQ feedback data signal (e.g., DR_*DQ_OUT) from the datapath hardmacro.

In one example, the block 422 may comprise a register 440, a multiplexer 442, a register 444, a multiplexer 446 and a register 448. The signal RESET may be presented to an asynchronous clear input of the register 440 and an asynchronous set input of the registers 444 and 448. The signal MC_R_VALID may be presented to control inputs of the multiplexers 442 and 446. A data input of the register 440 may be tied low (or a logic 0). A first data input of each of the multiplexers 442 and 446 may be tied high (or a logic 1). An output (e.g., Q) of the register 440 may be present to a second input of the multiplexer 442. An output of the multiplexer 442 may be presented to a data input of the register 446. An output (e.g., Q) of the register 444 may be presented to a second data input of the multiplexer 446. An output of the multiplexer 446 may be presented to a data input of the register 448. An output (e.g., Q) of the register 448 may present the single cycle pulse signal. In one example, the multiplexers 442 and 446 may be configured to select (i) the tied high input when the signal MC_R_VALID is high, or a logic 1 and (ii) the output of the respective registers 440 and 444 when the signal MC_R_VALID is low, or a logic 0.

In one example, the block 424 may comprise a gate 450, a gate 452, a gate 454, a gate 456, a gate 458 and a gate 460. The gates 450, 452 and 454 may be implemented, in one example, as inverters. The gate 456 may be implemented, in one example, as a two-input AND gate. The gate 458 may be implemented, in one example, as a two-input OR gate. The gate 460 may be implemented, in one example, as a four-input AND gate. However, other logic may be implemented accordingly to meet the design criteria of a particular implementation. The signal MASK_GATE may be present to an input of the gate 450. The signal WR_LEVELING_MODE may be presented to an input of the gate 452. The signal CTRL_MAN_PG may be presented to an input of the gate 454 and a first input of the gate 456. The single cycle pulse signal from the block 422 may be presented to a second input of the gate 456.

An output of the gate 454 may be presented to a first input of the gate 458. An output of the gate 456 may be presented to a second input of the gate 458. The signal CLK_GATING_EN may be presented to a first input of the gate 460. An output of the gate 450 may be presented to a second input of the gate 460. An output of the gate 452 may be presented to a third input of the gate 460. An output of the gate 458 may be presented to a fourth input of the gate 460. An output of the gate 460 may present the DQS gating related control signal to the first input of the block 426.

In one example, the block 426 may comprise a multiplexer 462 and a multiplexer 464. The multiplexer 462 may have a first data input that may be tied high (or a logic 1), a second data input that may be tied low (or logic 0) and a control input that may receive the signal WR_LEVELING_MODE. In one example, the multiplexer 462 may present the logic 1 level at an output in response to the signal WR_LEVELING_MODE being high (or logic 1) and the logic 0 level in response to the signal WR_LEVELING_MODE being low (or logic 0). The output of the multiplexer 462 may be connected to a first data input of the multiplexer 464. A second data input of the multiplexer 464 may receive the signal MC_R_VALID. A control input of the multiplexer 464 may receive the DQS gating related control signal from the block 424. In one example, the multiplexer 464 may present (i) the output of the multiplexer 462 as the signal QUAL_GATE in response to the DQS gating related control signal being high (or logic 1) and (ii) the signal MC_R_VALID as the signal QUAL_GATE in response to the DQS gating related control signal being low (or logic 0).

In one example, the block 428 may comprise a register 470, a multiplexer 472, a multiplexer 474, a register 476, a multiplexer 478, a register 480, a multiplexer 482, a register 484, a multiplexer 486, a register 488, a multiplexer 490, a register 492, a multiplexer 494 and a register 496. The registers 470, 476, 480, 484, 488, 492 and 496 may be implemented, in one example, as D-type flip-flops. The signal QUAL_GATE may be present to a data input of the register 470, a first data input of the multiplexer 472 and a first data input of the multiplexer 474. An output (e.g., Q) of the register 470 may be presented to a data input of the register 476 and a first data input of each of the multiplexers 478, 482, 486, 490 and 494.

An output of the register 476 may be presented to a second data input of the multiplexer 478. An output of the multiplexer 478 may be presented to a data input of the register 480. An output of the register 480 may be presented to a second data input of the multiplexer 482. An output of the multiplexer 482 may be presented to a data input of the register 484. An output of the register 484 may be presented to a second data input of the multiplexer 486. An output of the multiplexer 486 may be presented to a data input of the register 488. An output of the register 488 may be presented to a second data input of the multiplexer 490. An output of the multiplexer 490 may be presented to a data input of the register 492. An output of the register 492 may be presented to a second data input of the multiplexer 494. An output of the multiplexer 494 may be presented to a second data input of the multiplexer 474. An output of the multiplexer 474 may be presented to a data input of the register 496. An output of the register 496 may be presented to a second data input of the multiplexer 472. Each of the multiplexers 472, 474, 478, 482, 486, 490 and 494 may have a respective control input that may receive a respective bit of a programmable delay control signal (e.g., ITCY_SEL_BIT). An output of the multiplexer 472 may be presented to the DQS gating disable input of the datapath hardmacro.

The block 430 may be configured to generate the signal ITCY_SEL_BIT in response to a signal received from the block 432. In one example, the block 432 may comprise a pair of registers 500 and 502. The register 500 may have a data input that may receive a signal (e.g., RD_LATENCY[3:0] and an output (e.g., Q) that may present a signal to the block 430. The register 452 may have a data input that may receive the signal DR_*DQ_OUT from the datapath hardmacro. In one example, the registers 500 and 502 may be implemented as part of the control register block 118.

DDR3 write leveling is a scheme to adjust DQS to CK relationship by a memory controller, with a simple feedback provided by the DRAM. The memory controller involved in the leveling generally has adjustable delay setting on DQS to align a rising edge of DQS, through the DQ bus. The controller repeatedly delays DQS until a transition from 0 to 1 is detected. The DQS delay established through this exercise would ensure compliance with tDQSS, tDSS, and tDSH specifications.

To support the DDR3 write leveling, the address path (ADR) hardmacro of the PHY 100 may be used for sending the DRAM command signals and differential clock pairs (e.g., CK/CKN) to the DRAM device from the controller. Datapath hardmacro of the PHY 100 may also be used for the DQS delay adjustment process with the DRAM device. As shown in the FIGS. 12 and 13, a controller/firmware may use the write leveling circuit to configure the DQS port of the PHY 100 in output mode. The write leveling circuit may constantly drive the DQS enable signal to logic LOW. The controller/firmware may also change the logic state of write_leveling_pulse bit (a static control signal) in the control register block 118 from logic level LOW to HIGH. The switching may generate a single cycle of DQS toggling enable signal at the input of the datapath hardmacro, which in turn, may generate a single DQS pulse at the DRAM DQS port. After tWOL timing parameter expired, the DRAM may return the DQS feedback bit on the DQ bus. The DQ bit that carries the feedback result of the DQS edge alignment may be sampled by the PHY 100 and captured in the control register block 118. The controller/firmware then may check the feedback result by reading the corresponding registers in the control register block 118. Until a transition from 0 to 1 of the DQS feedback bit is found, the controller may continue to adjust the DQS delay by changing the output delay of the DQS signal in the DP hardmacro. In the DP hardmacro, the output timing of the DQS signal is adjustable. The adjustment is provided by a static configuration register inside the datapath hardmacro. The static configuration register may be made available to the user/controller by remapping it in the control register address space of the PHY 100.

DDR3 preamble generation circuitry implemented within soft logic of the PHY 100 and the datapath hardmacro are generally described in connection with FIGS. 12 and 13. For example, the circuit that is related to the signal MC_W_VALID and the input DQS toggling enable port of datapath hardmacro. For DDR2, preamble period may be defined as one cycle of logic low level driven on DQS signal prior to first rising edge of DQS. For DDR3, a slight difference is that the DQS signal may be driven to logic high from tri-state for one-half clock cycle and then to logic low for another one-half clock cycle before the first rising edge. Because of the additional falling edge, the DQS toggling enable signal may be asserted one cycle earlier appearing at the input of datapath hardmacro as shown in the diagram. To support the combo DDR2/3 feature, the control signal and its delayed version may be multiplexed at the input port of the datapath hardmacro to give different assertion timing of the signal.

DDR2 and DDR3 read latency delay circuitry within soft logic of the PHY 100 and the datapath hardmacro is described in connection with FIG. 17. The variable read latency delay line circuitry (partial DQS gating circuit) may be configured for controlling the propagation of the read DQS signal. In normal functional mode, the circuit may provide correct DQS gating disable timing, such that the DQS signal is propagated properly within the correct data transfer window (e.g., between preamble and postamble period). Read latency of a DDR2 device may range from 2 cycles to 12 cycles, whereas for a DDR3 device read latency may range from 4 cycles to 20 cycles. In order to support DDR2 and DDR3, the circuit together with the adjustable read latency inside the datapath hardmacro may provide an adjustment range up to 20 cycles. Before the PHY 100 runs in a normal functional mode, the PHY 100 generally goes through a training process to determine a correct DQS gating timing window. The circuit generally enables the execution of the training process. In DQS gating training mode, the circuit provides a single cycle window of disabling the gating to the DQS signal at variable delay time during the training process. The use of single cycle window of the disablement works together with a state machine and the DQS gating circuit inside the datapath hardmacro to determine an optimal DQS gating disabling timing of the DQS signal (e.g., between the middle of the preamble and postamble period).

Figure 18:
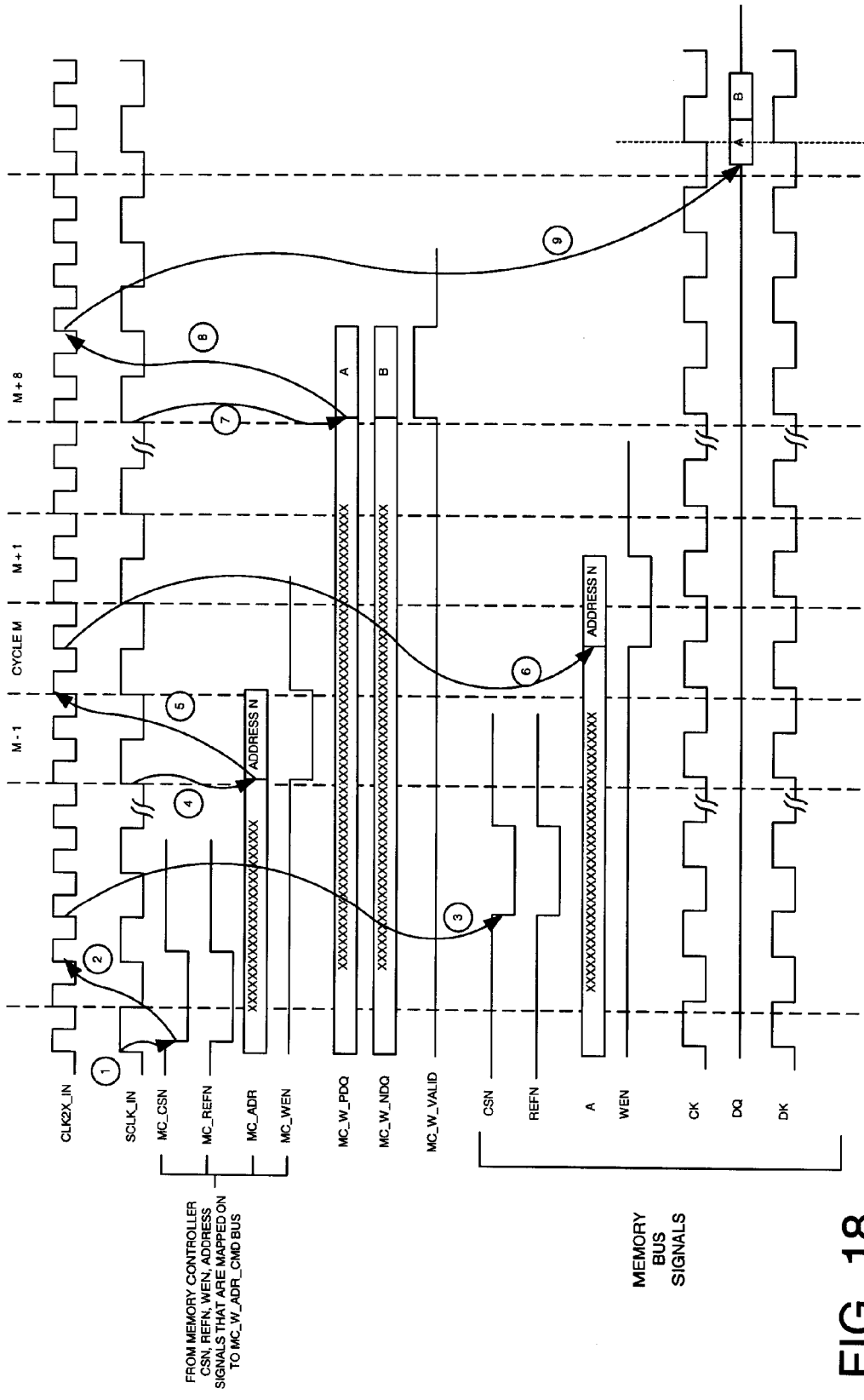
FIGS. 18-24 are timing diagrams illustrating operations of a multiple memory standard physical layer macro function in accordance with the present invention.

Referring to FIG. 18, a timing diagram is shown illustrating a functional timing example for a RLDRAM-II+ write operation. Memory control signals (e.g., chip select (CS), refresh (REFN), address (A), and write enable (WEN) signals) may be mapped to memory controller input ports (e.g., MC_W_ADR_CMD bus) of the PHY 100. Arrow 1 generally identifies a point when the memory control signals are presented by the memory controller at a rising edge of the signal SCLK_IN. The PHY 100 samples the memory control signals in the internal 1× clock domain. The internal 1× clock domain may be generated from the signal CLK2X_IN. The internal clock domain may be in phase with the signal SCLK_IN. Arrow 2 generally identifies a point when the memory control signals may be sampled approximately at a second rising edge of the signal CLK2X_IN subsequent to the rising edge at which the signals are presented. At the rising edge of the signal CLK2X_IN following the sampling of the memory control signals, the PHY 100 presents the signals CSN and REFN at ADR_CMD_OUT output ports (e.g., identified by Arrow 3). The address signals are handled similarly as indicated by Arrows 4, 5 and 6.

Arrow 7 generally identifies a point when the PHY 100 may be viewed as providing pipeline registers for the memory controller executing the memory control protocol. The memory controller issues memory write command and address signals at cycle M−1. The write control and address signals are presented on the memory bus at cycle M. With a read latency of eight cycles, write data are issued at cycle M+8 by the memory controller. Arrow 8 generally identifies a point when the write data is transferred to the 2× clock domain inside a datapath (DP) hardmacro at approximately the second rising edge of the signal CLK2X_IN. Arrow 9 generally identifies a point when the PHY 100 sends out sampled write data at approximately the fourth falling edge of the signal CLK2X_IN after the data is sampled in the internal 2× clock domain of the DP hardmacro.

Figure 19:
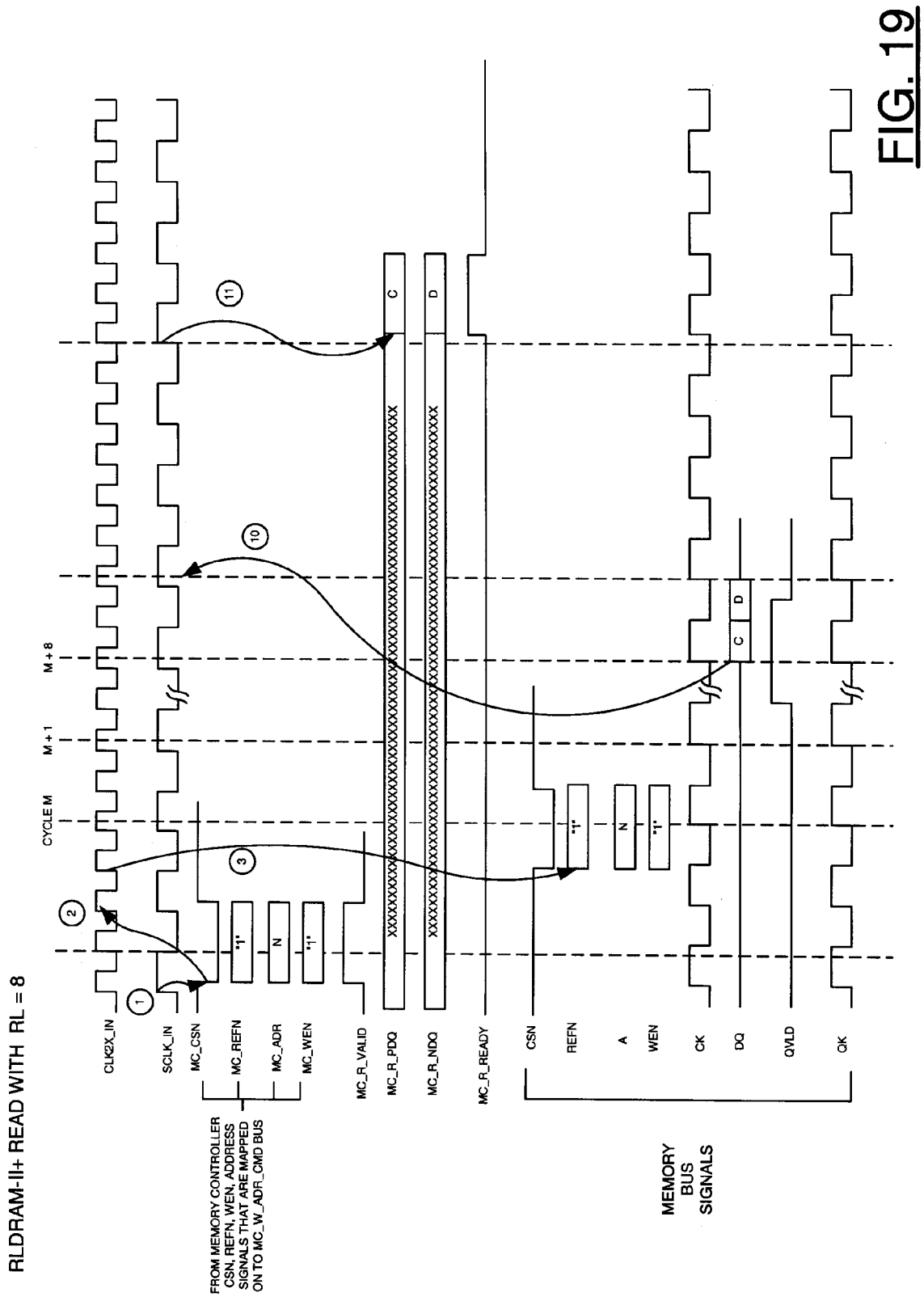

Referring to FIG. 19, a timing diagram is shown illustrating a functional timing example for a RLDRAM-II+ read operation. With reference to Arrows 1, 2 and 3 in FIG. 19, the memory control functional timing for a RLDRAM-II+ read is similar to the timing illustrated in FIG. 18 for a write. The memory read command and address appear on the memory bus at cycle M. Arrow 10 generally identifies a point when, with a read latency of eight cycles, memory data signals (e.g., DQ) and a data valid signal (e.g., QVLD) appear on the memory bus at cycle M+8. Using a DP18 hardmacro, the PHY 100 samples the signals DQ, QVLD, QK/QK# and synchronizes the signals DQ, QVLD, QK/QK# with the SCLK_IN clock domain. Inside the DP18 hardmacro, the signal QK/QK# is delayed by a quarter cycle to capture the signals DQ and QVLD. After the read data and data valid signals are captured, the DP18 hardmacro forwards the captured signals and delayed clocks to an asynchronous first-in, first-out (FIFO) external to the DP18 hardmacro. The asynchronous FIFO logic may use the data valid signal to enable data to be written into the FIFO and to increment a write pointer. The write pointer and read data are then synchronized to the SCLK_IN domain. Arrow 11 generally identifies a point when the PHY 100 sends out the read data at MC_R_PDQ and MC_R_NDQ output ports and asserts a read data ready signal (e.g., MC_R_READY) at approximately the third subsequent rising edge of the signal SCLK_IN.

Figure 20:
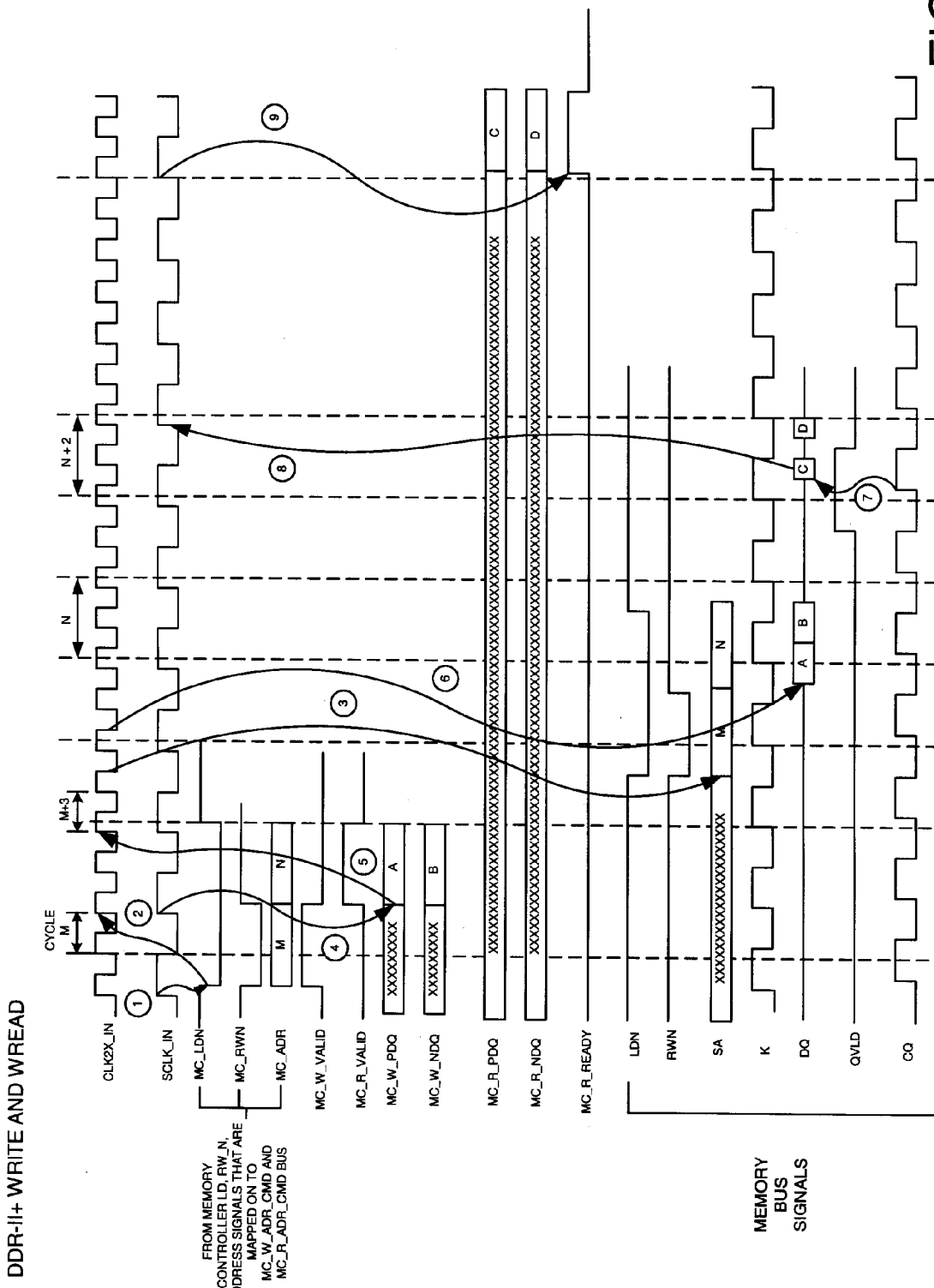

Referring to FIG. 20, a timing diagram is shown illustrating a functional timing example for a DDR-II+ SRAM (CIO) write and read operations. Arrow 1 generally identifies a point when the memory controller presents memory control signals (e.g., LD, RW_N, and SA) on the MC_W_ADR_CMD and MC_R_ADR_CMD busses and asserts a data valid signal (e.g., MC_W_VALID) to indicate to the PHY 100 that a memory write operation is being performed. The signal MC_LDN is asserted for two SCLK_IN cycles. The signal LDN is then asserted for two K cycles accordingly. The first assertion cycle is for a SRAM write, and the next assertion cycle is for a SRAM read.

Arrow 2 generally identifies a point when the PHY 100 transfers the memory control signals into the internal 1× clock domain of the PHY 100. The internal 1× clock domain may be generated from the clock signal CLK2X_IN and have the same phase as the clock signal SCLK_IN. The memory control signals are sampled at approximately the second subsequent rising edge of the clock signal CLK2X_IN. At approximately the fourth subsequent falling edge of the clock signal CLK2X_IN after the control signals are sampled into the internal 1× domain, the PHY 100 presents the memory control signals on the memory bus (as identified by Arrow 3).

Arrow 4 generally identifies a point when the memory controller puts write data onto the MC_W_PDQ and MC_W_NDQ busses according to the DDR-II+ SRAM memory write protocol. The memory controller also asserts the data valid signal MC_R_VALID and sends memory control signals to the PHY 100 to indicate that the operation is a memory read. Arrow 5 generally identifies a point when the PHY 100 transfers the write data into the internal 1× clock domain.

Arrow 6 generally identifies a point when the PHY 100 sends out the write data onto the memory bus at approximately the third subsequent falling edge of the clock signal CLK2X_IN after write data is transferred to the internal 1× domain of the DP. Arrow 7 generally identifies a point when read command and address signals appear on the memory bus at cycle N. According to the memory read protocol, the memory device put the read data on the memory bus at cycle N+2. Arrow 8 generally identifies a point when the read data (DQ), data valid (QVLD) and return clock (e.g., CQ/CQ#) signals entering the PHY 100 through the DP18 hardmacro. Inside the DP18 hardmacro, the signal CQ/CQ# is delayed by a quarter cycle to capture the signals DQ and QVLD. After the read data and data valid signals are captured, the DP18 hardmacro forwards the captured signals and the delayed clocks to an asynchronous first-in, first-out (FIFO) external to the DP18 hardmacro. The asynchronous FIFO logic may use the data valid signal to enable data to be written into the FIFO and to increment a write pointer. The write pointer and read data are then synchronized to the SCLK_IN domain. The PHY 100 sends out the read data at MC_R_PDQ and MC_R_NDQ output ports and asserts the MC_R_READY signal at approximately the third subsequent rising edge of the signal SCLK_IN (e.g., identified by Arrow 9).

Figure 21:
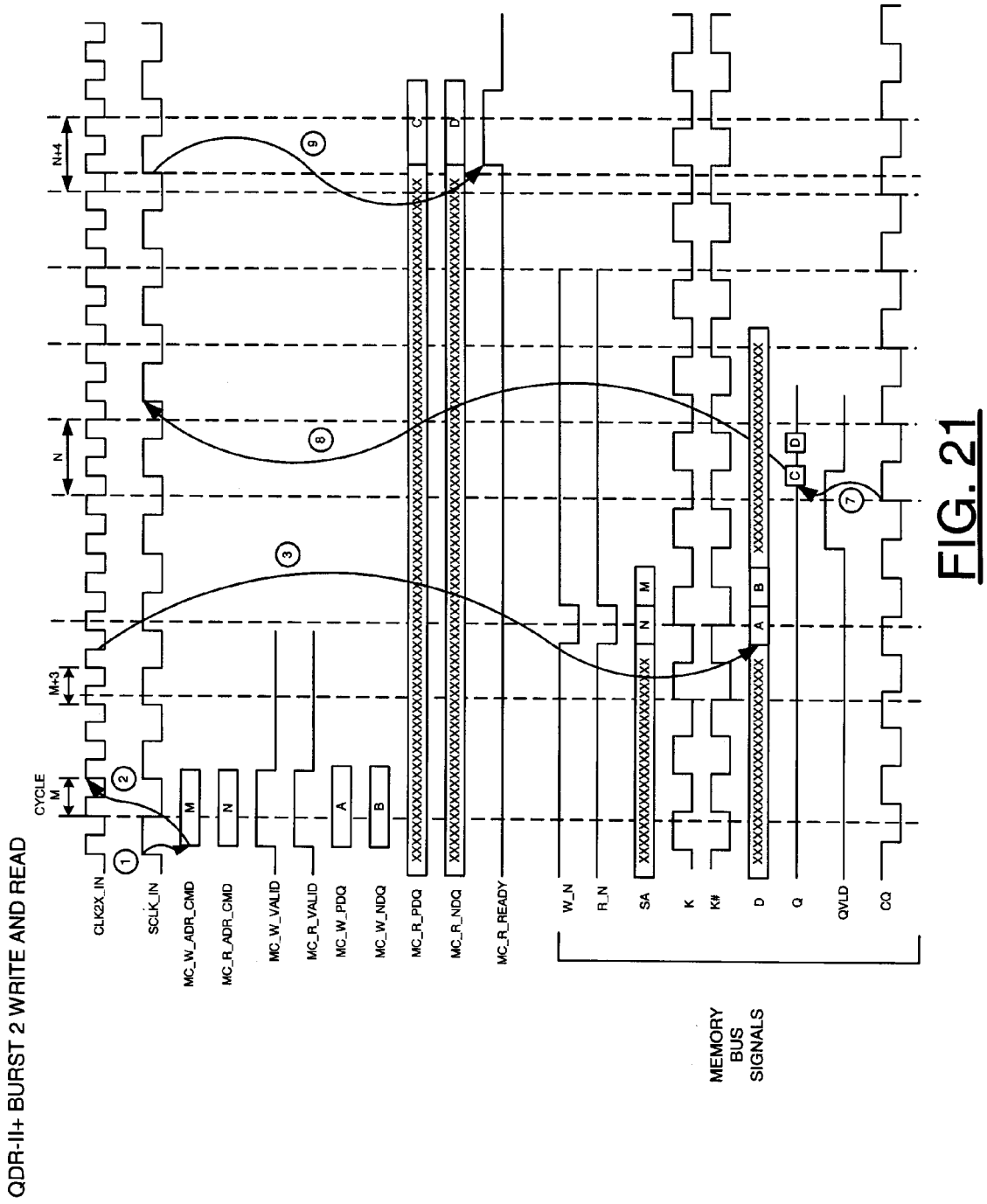

Referring to FIG. 21, a timing diagram is shown illustrating a functional timing example for a QDR-II+ burst write and read operations. Arrow 1 generally identifies the memory controller asserting memory control signals, read and write address, write data, and write and read valid signals to indicate to the PHY 100 that the current operation comprises memory read and write operations. Arrow 2 generally identifies the PHY 100 transferring the memory control signals into the internal 1× clock domain of the PHY 100. The internal 1× clock domain of the PHY 100 may be generated from the clock signal CLK2X_IN and have the same phase as the clock signal SCLK_IN. The memory control signals are sampled at approximately the second subsequent rising edge of the clock signal CLK2X_IN.

Arrow 3 generally identifies a point when the PHY 100 sends out the memory control signals and write data onto the memory bus at approximately the fourth subsequent falling edge of the clock signal CLK2X_IN after the control signals are sampled into the internal 1× clock domain. Arrow 7 generally identifies a point when the read command and address appears on the memory bus at cycle N. According to the memory read protocol, a memory device puts the read data on the memory bus at cycle N+2.

Arrow 8 generally identifies a point when the read data (e.g., DQ), the data valid (e.g., QVLD), and the return clock (e.g., CQ/CQ#) signals enter the PHY 100 through the DP18 hardmacro. Inside the DP18 hardmacro, the signal CQ/CQ# may be delayed by a quarter cycle to capture the signals DQ and QVLD. After the read data DQ signal and the data valid QVLD signal are captured, the DP18 hardmacro forwards the captured signals and delayed clocks to an asynchronous FIFO external to the hardmacro. The asynchronous FIFO logic may be configured to use the data valid signal QVLD to enable writing of data into the FIFO and to increment a write pointer.

The write pointer and read data are then synchronized to the SCLK_IN domain. Arrow 9 generally identifies a point when the PHY 100 sends out the read data at the MC_R_PDQ and MC_R_NDQ output ports and asserts the MC_R_READY signal at approximately the third subsequent rising edge of the clock signal SCLK_IN.

Figure 22:
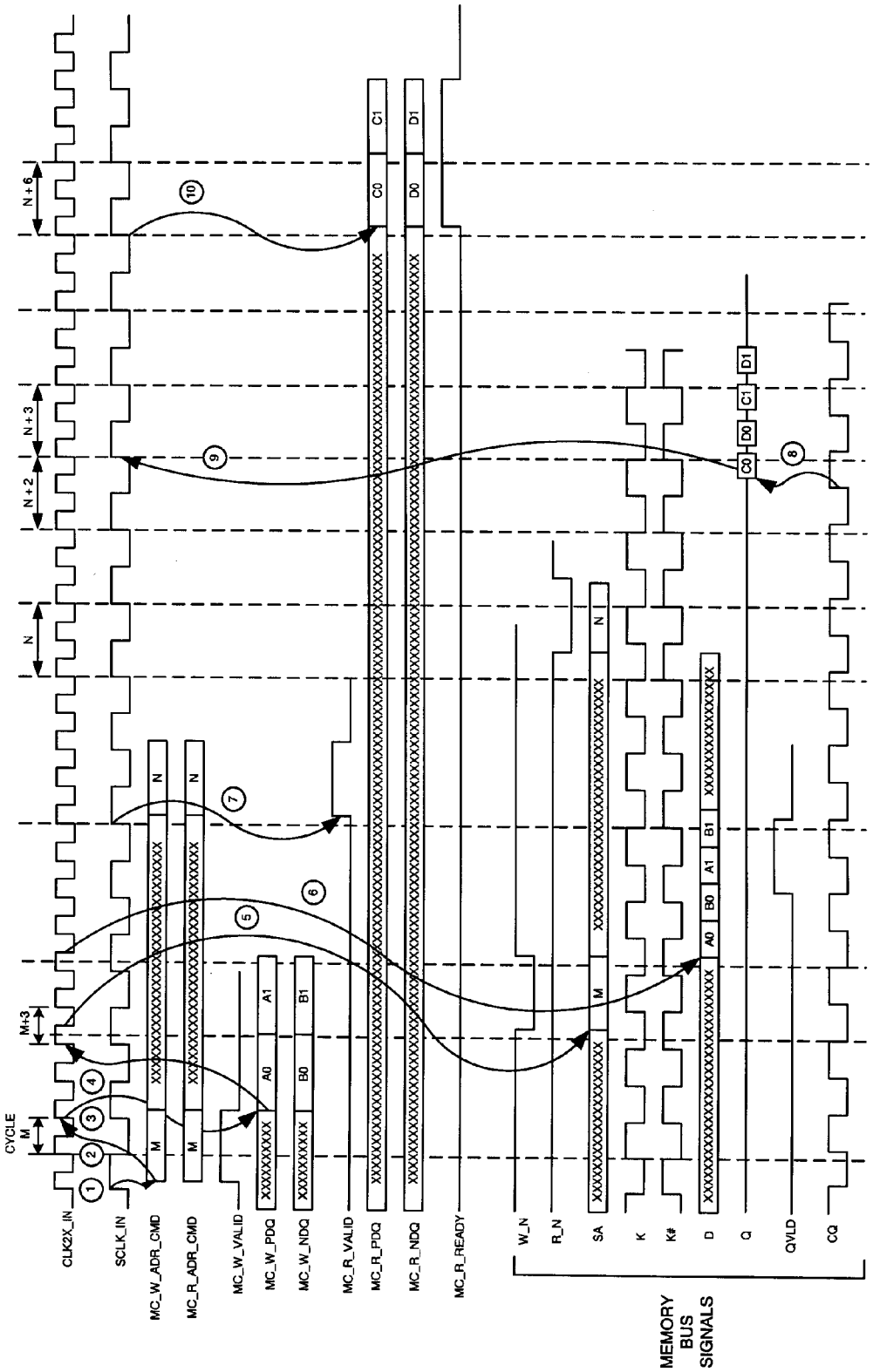

Referring to FIG. 22, a timing diagram is shown illustrating a functional timing example for a QDR-II+ burst 4 write and read operations. Arrow 1 generally identifies a point when the memory controller asserts memory control signals, write address, and write valid signals at the first rising edge of the clock signal SCLK_IN to indicate to the PHY 100 that the operation comprises a memory write operation. Arrow 2 identifies a point when the PHY 100 transfers the memory control signals into the internal 1× clock domain of the PHY 100. The internal 1× clock domain of the PHY 100 may be generated from the clock signal CLK2X_IN and have the same phase as the clock signal SCLK_IN. The memory control signals are sampled at approximately the second subsequent rising edge of the clock signal CLK2X_IN. Arrow 3 generally identifies a point when the memory controller puts the write data onto the input ports (e.g., MC_W_PDQ and MC_W_NDQ) of the PHY 100 for two cycles. Arrow 4 generally identifies the point when the PHY 100 transfers the write data into the internal 1× clock domain of the PHY 100. The memory write data is sample at approximately the second subsequent rising edge of the clock signal CLK2X_IN. Arrow 5 generally identifies a point when the PHY 100 sends out the memory control signals onto the memory bus at approximately the fourth subsequent falling edge of the clock signal CLK2X_IN after the control signals are sampled into the internal 1× clock domain.

Arrow 6 generally identifies a point when the PHY 100 sends out the write data onto the memory bus at approximately the fourth subsequent falling edge of the clock signal CLK2X_IN after the write data is sampled into the internal 1× clock domain. Arrow 7 generally identifies a point when the memory controller asserts the memory control signals, the read address, and the read valid signal at the first rising edge of clock signal SCLK_IN to indicate to the PHY 100 that the operation comprises a memory read operation. The read command and address appear on the memory bus at cycle N. Arrow 8 generally identifies a point (e.g., at cycle N+2) when the memory device puts the read data on the memory bus according to the memory read protocol.

Arrow 9 generally identifies a point when the read data signal DQ, the data valid signal QVLD, and the return clock signals CQ/CQ# enter the PHY 100 through the DP18 hardmacro. Inside the DP18 hardmacro, the signals CQ/CQ# may be delayed by a quarter cycle to capture the signal DQ and the signal QVLD. After the read data and the data valid signals are captured, the DP18 hardmacro forwards the captured signals and the delayed clocks to an asynchronous FIFO external to the hardmacro. The asynchronous FIFO logic may use the data valid signal to enable writing data into the FIFO and to increment a write pointer. The write pointer and read data are then synchronized to the SCLK_IN domain. Arrow 10 generally identifies a point when the PHY 100 sends out the read data at output ports (e.g., MC_R_PDQ and MC_R_NDQ) and asserts the data ready signal MC_R_READY at approximately the third subsequent rising edge of the clock signal SCLK_IN. In general, the signals on the MC_R_PDQ and MC_R_NDQ busses illustrated in FIGS. 2 through 5 may actually be presented by the PHY 100 a few cycles earlier than assertion of the data valid signal MC_R_VALID. However, the values of the buses are not considered valid until the signal MC_R_VALID is asserted.

Figure 23:
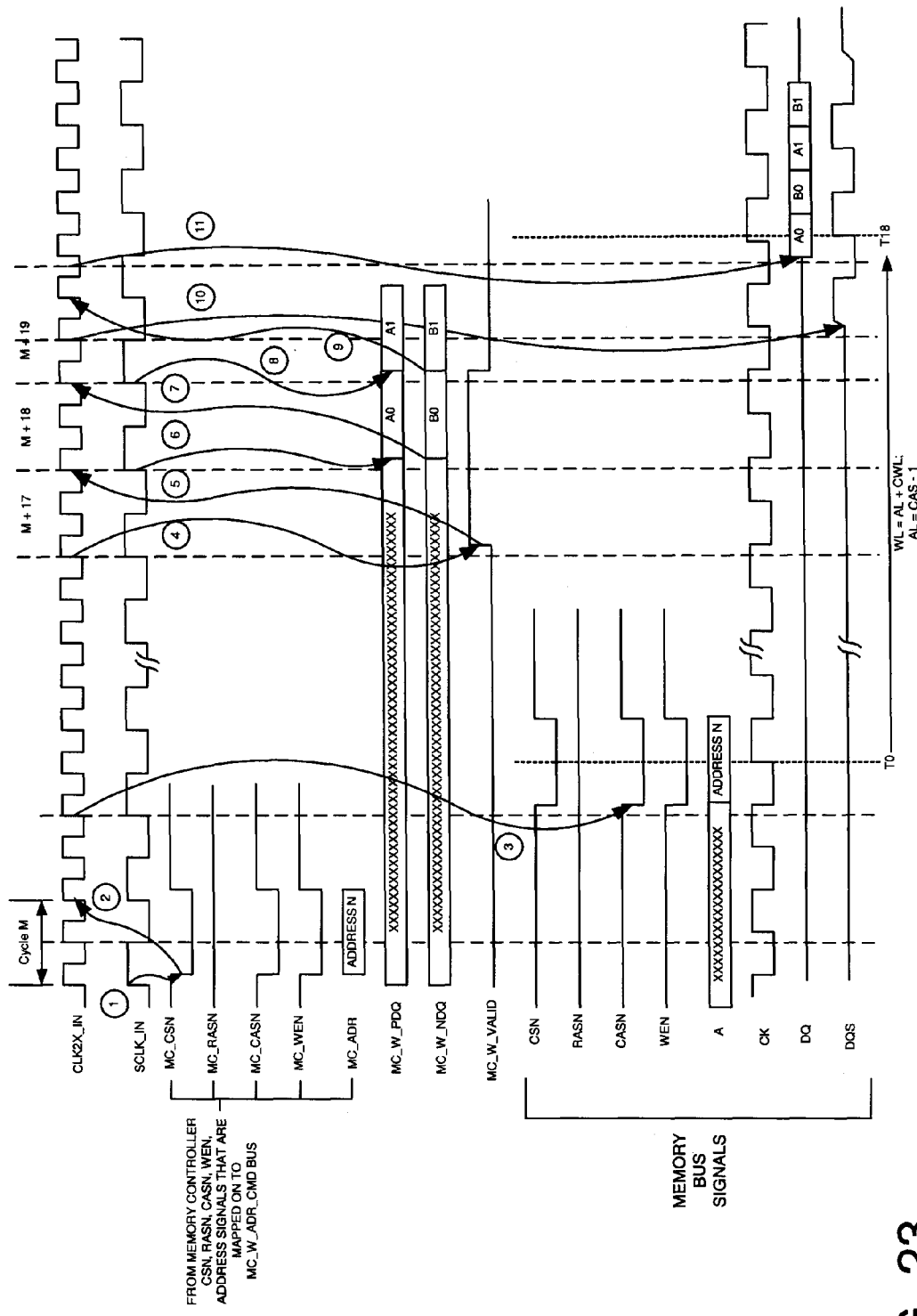

Referring to FIG. 23, a timing diagram is shown illustrating a functional timing example for a DDR3 write operation. Arrow 1 generally identifies a point when the memory controller asserts memory control signals, and write address signals at the first rising edge of the clock signal SCLK_IN to indicate to the PHY 100 that the operation is a memory write operation. Arrow 2 generally identifies a point when the PHY 100 transfers the memory control signals into the internal 1× clock domain of the PHY 100. The internal 1× clock domain of the PHY 100 may be generated from the clock signal CLK2X_IN and have the same phase as the clock signal SCLK_IN. The memory control signals are sampled at approximately the second subsequent rising edge of clock signal CLK2X_IN.

Arrow 3 generally identifies a point when the PHY 100 sends out the memory control signals onto the memory bus at approximately the second subsequent falling edge of the clock signal CLK2X_IN after the control signals are sampled into the internal 1× clock domain of the PHY 100. The memory control signals and write address generally appears on the memory bus at T0. Arrow 4 generally identifies a point when the PHY 100 may be viewed as pipeline registers for the memory controller. To satisfy the memory device write protocol, the memory controller asserts a write valid signal on a MC_W_VALID input of the PHY 100 for two cycles at cycle M+17. The write valid signal may be connected to output buffer enable signals of the SSTL IO buffers that are embedded inside DP hardmacro.

Arrow 5 generally identifies a point when the PHY 100 transfers the write data valid (or output buffer enable) signal into the internal 1× clock domain of the PHY 100. The output buffer enable signal is sampled at approximately the second subsequent rising edge of the clock signal CLK2X_IN. Arrows 6 and 8 generally identify points when the memory controller puts the write data onto the input ports (e.g., MC_W_PDQ and MC_W_NDQ) of the PHY 100 for two cycles. Arrows 7 and 9 generally identify points when the PHY 100 transfers the write data into the internal 1× clock domain of the PHY 100. The memory write data are sampled at approximately the second subsequent rising edge of the clock signal CLK2X_IN.

Arrow 10 generally identifies a point when the PHY 100 sends out a data strobe signal (e.g., DQS) onto the memory bus at approximately the third subsequent rising edge of the clock signal CLK2X_IN after the signal MC_W_VALID is sampled into the internal 1× clock domain of the hardmacro. A first byte of write data appears on the memory bus at T18. Arrow 11 generally identifies a point when the PHY 100 sends out the write data onto the memory bus at approximately 2.75 cycles of the clock signal CLK2X_IN after the write data is sampled into the internal 1× clock domain of the hardmacro. In general, WL (Write Latency)=AL (Additive Latency)+CWL (CAS Write Latency). AL=1 means that AL=CL (CAS Latency)−1

Figure 24:
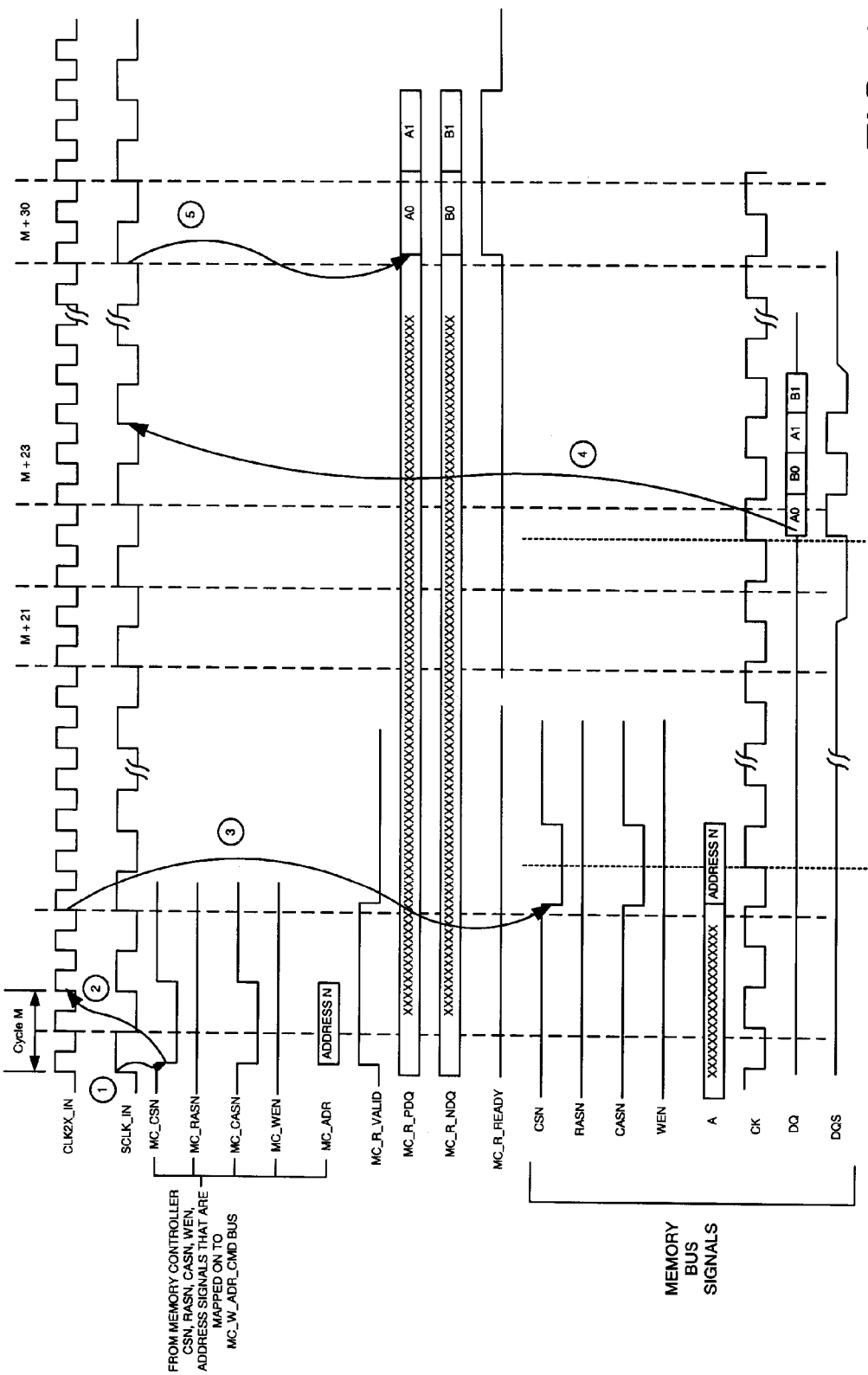

Referring to FIG. 24, a timing diagram is shown illustrating a functional timing example for a DDR3 write operation. Arrow 1 generally identifies a point when the memory controller asserts memory control signals, and write address signals at the first rising edge of the clock signal SCLK_IN to indicate to the PHY 100 that the operation comprises a memory write operation. Arrow 2 generally identifies a point when the PHY 100 transfers the memory control signals into the internal 1× clock domain of the PHY 100. The internal 1× clock domain of the PHY 100 may be generated from the clock signal CLK2X_IN and have the same phase as the clock signal SCLK_IN. The memory control signals are generally sampled at approximately the second subsequent rising edge of the clock signal CLK2X_IN.

Arrow 3 generally identifies a point when the PHY 100 sends out the memory control signals onto the memory bus at approximately the second subsequent falling edge of the clock signal CLK2X_IN after the control signals are sampled into the internal 1× clock domain of the PHY 100. The memory control signals and the write address appear on the memory bus at T0. Arrow 4 generally identifies a point when, according to the memory read protocol, a memory device puts the read data on the memory bus at T21. In general, RL (Read Latency)=AL+CL; AL (Additive Latency)=1 means that AL=CL−1. Therefore, RL=2*CL−1 in this case. The read data signals (e.g., DQ) enter The PHY 100 through a DP8 hardmacro. Inside The DP8 hardmacro, The data strobe signal DQS is delayed by a quarter cycle to capture The read data signals DQ. After The read data signals DQ are captured, The DP8 hardmacro forwards The captured signals and The delayed clocks to an asynchronous FIFO external to The hardmacro. The asynchronous FIFO logic may use The delayed clocks to write data into The FIFO and to increment a write pointer. The write pointer and read data are then synchronized to SCLK_IN domain.

Arrow 5 generally identifies a point when The PHY 100 sends out The read data signal at The output ports (e.g., MC_R_PDQ and MC_R_NDQ) and asserts The read data ready signal MC_R_READY at approximately The seventh subsequent rising edge of The clock signal SCLK_IN if data is received from The memory bus in cycle M+23.

While The invention has been particularly shown and described with reference to the preferred embodiments thereof, it will be understood by those skilled in the art that various changes in form and details may be made without departing from the scope of the invention.

The invention claimed is:

1. A memory interface physical layer macro comprising:
   one or more embedded input/output (I/O) buffers that support a plurality of I/O supply voltage levels;
   one or more datapath hardmacros coupled to said one or more embedded I/O buffers; and
   control logic that controls said one or more datapath hardmacros and said one or more I/O buffers, wherein
   (i) said control logic comprises a write datapath logic for each of said one or more datapath hardmacros,
   (ii) each write datapath logic comprises (a) a write leveling pulsing circuit configured to generate an output in response to a signal implementing a write leveling pulse signal and (b) a preamble generation circuit configured to present a DQS enable signal, a DM enable signal, a DQ enable signal, and a DQS toggling enable signal to a respective datapath hardmacro in response to a first signal configured to indicate a write leveling mode, a second signal implementing a write control signal, a third signal indicating a memory mode, and said output of said write leveling pulsing circuit.

2. The memory interface physical layer macro according to claim 1, wherein said one or more datapath hardmacros are selected from the group consisting of an 8-bit datapath hardmacro, an 18-bit datapath hardmacro, and an 36-bit datapath hardmacro.

3. The memory interface physical layer macro according to claim 2, wherein said one or more datapath hardmacros support a plurality of memory interface standards.

4. The memory interface physical layer macro according to claim 1, wherein said one or more embedded input/output (I/O) buffers support operating voltages ranging from about 1.4V to about 1.9V.

5. The memory interface physical layer macro according to claim 1, wherein said control logic controls a slew rate or said one or more embedded input/output (I/O) buffers.

6. The memory interface physical layer macro according to claim 1, said control logic further comprises DDR3 write leveling delay circuitry.

7. The memory interface physical layer macro according to claim 1, wherein said control logic further comprises DDR3 write leveling mode support circuitry.

8. The memory interface physical layer macro according to claim 1, wherein said control logic further comprises DDR3 preamble generation circuitry.

9. The memory interface physical layer macro according to claim 1, wherein said control logic further comprises DDR2 and DDR3 read latency delay line circuitry.

10. The memory interface physical layer macro according to claim 1, wherein said memory interface physical layer macro support a plurality of memory technologies.

11. The memory interface physical layer macro according to claim 1, wherein said memory interface physical layer macro supports at least two memory technologies selected from the group consisting of DDR2 SDRAM, DDR3 SDRAM, QDR-II SRAM, QDR-II+ SRAM, DDR-II SRAM, DDR-II+ SRAM and RLDRAM-II SRAM.

12. The memory interface physical layer macro according to claim 1, wherein said one or more datapath hardmacros are part of one or more memory interface hardmacros that comprise:
   a digital datapath logic portion;
   an I/O buffer portion; and
   a decoupling capacitor portion.

13. The memory interface physical layer macro according to claim 1, further comprising at least one of a 9-bit address and control (ADR) hardmacro and a 12-bit address and control (ADR) hardmacro.

14. A non-transitory computer readable storage medium comprising computer readable instructions configured to generate a memory interface physical layer macro comprising one or more embedded input/output (I/O) buffers that support a plurality of I/O supply voltage levels, one or more datapath hardmacros coupled to said one or more embedded I/O buffers and control logic that controls said one or more datapath hardmacros and said one or more I/O buffers, wherein
   (i) said control logic comprises a write datapath logic for each of said one or more datapath hardmacros,
   (ii) each write datapath logic comprises (a) a write leveling pulsing circuit configured to generate an output in response to a signal implementing a write leveling pulse signal and (b) a preamble generation circuit configured to present a DQS enable signal, a DM enable signal, a DQ enable signal, and a DQS toggling enable signal to a respective datapath hardmacro in response to a first signal configured to indicate a write leveling mode, a second signal implementing a write control signal, a third signal indicating a memory mode, and said output of said write leveling pulsing circuit.

15. The non-transitory computer readable storage medium according to claim 14, wherein said computer readable instructions comprise a hardware description language (HDL) representation of said memory interface physical layer macro.

16. An integrated circuit comprising:
   one or more embedded input/output (I/O) buffers that support a plurality of I/O supply voltage levels;

one or more datapath hardmacros coupled to said one or more embedded I/O buffers; and control logic that controls said one or more datapath hardmacros and said one or more I/O buffers, wherein (i) said control logic comprises a write datapath logic for each of said one or more datapath hardmacros, (ii) each write datapath logic comprises (a) a write leveling pulsing circuit configured to generate an output in response to a signal implementing a write leveling pulse signal and (b) a preamble generation circuit configured to present a DQS enable signal, a DM enable signal, a DQ enable signal, and a DQS toggling enable signal to a respective datapath hardmacro in response to a first signal configured to indicate a write leveling mode, a second signal implementing a write control signal, a third signal indicating a memory mode, and said output of said write leveling pulsing circuit.

17. The integrated circuit according to claim 16, wherein said one or more datapath hardmacros are selected from the group consisting of an 8-bit datapath hardmacro, an 18-bit datapath hardmacro, and an 36-bit datapath hardmacro.

18. The integrated circuit according to claim 16, wherein said control logic further comprises DDR3write leveling delay circuitry and write leveling mode support circuitry.

19. The integrated circuit according to claim 16, wherein said one or more datapath hardmacros support a plurality of memory technologies.

20. The integrated circuit according to claim 16, wherein said one or more datapath hardmacros support at least two memory technologies selected from the group consisting of DDR2 SDRAM, DDR3 SDRAM, QDR-II SRAM, QDR-II+ SRAM, DDR-II SRAM, DDR-II+ SRAM and RLDRAM-II SRAM.

21. The integrated circuit according to claim 16, wherein said one or more datapath hardmacros are part of one or more memory interface hardmacros that comprise:

a digital datapath logic portion;

an I/O buffer portion; and a decoupling capacitor portion.

22. The integrated circuit according to claim 16, further comprising at least one of 9-bit address and control (ADR) hardmacro and a 12-bit address and control (ADR) hardmacro.

* * * * *